US009120974B2

(12) United States Patent
Hong et al.

(10) Patent No.: US 9,120,974 B2
(45) Date of Patent: Sep. 1, 2015

(54) PHOSPHOR AND LIGHT-EMITTING DEVICE USING SAME

(71) Applicant: MITSUBISHI CHEMICAL CORPORATION, Chiyoda-ku (JP)

(72) Inventors: Byungchul Hong, Yokohama (JP); Naoto Kijima, Machida (JP)

(73) Assignee: MITSUBISHI CHEMICAL CORPORATION, Chiyoda-ku (JP)

( * ) Notice: Subject to any disclaimer, the term of this patent is extended or adjusted under 35 U.S.C. 154(b) by 177 days.

(21) Appl. No.: 13/852,481

(22) Filed: Mar. 28, 2013

(65) Prior Publication Data

US 2013/0241397 A1    Sep. 19, 2013

Related U.S. Application Data

(63) Continuation of application No. PCT/JP2011/072086, filed on Sep. 27, 2011.

(30) Foreign Application Priority Data

Sep. 28, 2010 (JP) ................................. 2010-217251

(51) Int. Cl.
*C09K 11/08* (2006.01)
*C09K 11/64* (2006.01)
*C09K 11/77* (2006.01)
*H05B 33/12* (2006.01)
*H01L 33/50* (2010.01)

(52) U.S. Cl.
CPC ......... *C09K 11/7734* (2013.01); *C09K 11/0883* (2013.01); *H05B 33/12* (2013.01); *H01L 33/502* (2013.01); *H01L 2224/48091* (2013.01); *H01L 2224/48247* (2013.01)

(58) Field of Classification Search
USPC ..................................................... 252/301.4 F
See application file for complete search history.

(56) References Cited

U.S. PATENT DOCUMENTS

2003/0006469 A1   1/2003   Ellens et al.
2006/0001352 A1   1/2006   Maruta et al.
(Continued)

FOREIGN PATENT DOCUMENTS

EP    1 935 921 A1    6/2008
JP    2003-37295     2/2003
(Continued)

OTHER PUBLICATIONS

International Preliminary Report on Patentability and Written Opinion issued Apr. 16, 2013 in Application No. PCT/JP2011/072086.
(Continued)

*Primary Examiner* — Carol M Koslow
(74) *Attorney, Agent, or Firm* — Oblon, McClelland, Maier & Neustadt, L.L.P.

(57) ABSTRACT

Provided is a phosphor having enhanced luminance with respect to that of conventional β-type sialon phosphors. A phosphor having enhanced luminance is obtained by causing Al, O (oxygen) and Eu to be present at specific concentrations in a produced β-type sialon phosphor. Specifically, provided is a β-type sialon phosphor containing Si, Al, O, N and Eu, wherein the Al concentration in the phosphor ranges from 0.80 mass % or higher to 2.25 mass % or lower, the O concentration ranges from 0.36 mass % or higher to 1.15 mass % or lower, the Eu concentration ranges from 0.40 mass % or higher to 0.80 mass % or lower and a ratio (Al/O) of the Al concentration with respect to the O concentration ranges from 2.0 or higher to 3.0 or lower.

9 Claims, 13 Drawing Sheets

(56) References Cited

U.S. PATENT DOCUMENTS

| | | |
|---|---|---|
| 2007/0108896 A1 | 5/2007 | Hirosaki |
| 2007/0194695 A1 | 8/2007 | Yoon et al. |
| 2009/0129052 A1 | 5/2009 | Hirosaki |
| 2009/0153028 A1 | 6/2009 | Hirosaki |
| 2010/0053932 A1 | 3/2010 | Emoto et al. |
| 2011/0031874 A1 | 2/2011 | Hosokawa et al. |
| 2012/0162573 A1* | 6/2012 | Takahashi et al. .............. 349/61 |

FOREIGN PATENT DOCUMENTS

| | | |
|---|---|---|
| JP | 2007-145919 | 6/2007 |
| JP | 2008-303331 | * 12/2008 |
| WO | WO 2008/062781 A1 | 5/2008 |
| WO | WO 2009/093427 A1 | 7/2009 |
| WO | WO 2011/024882 | * 3/2011 |

OTHER PUBLICATIONS

International Search Report issued Jan. 17, 2012 in Application No. PCT/JP2011/072086.

Rong-Jun Xie, et al., "2-phosphor-converted white light-emitting diodes using oxynitride/nitride phosphors", Applied Physics Letters, vol. 90, 191101, 2007, 4 pages.

Japanese Office Action dated Jun. 30, 2015, in Japanese Patent Application No. 2012-536481 (with English Translation).

* cited by examiner

PHOSPHOR AND LIGHT-EMITTING DEVICE USING SAME

CROSS-REFERENCE TO RELATED APPLICATIONS

This is a continuation of International Application PCT/JP2011/072086, filed on Sep. 27, 2011, and designated the U.S., (and claims priority from Japanese Patent Application 2010-211251 which was filed on Sep. 28, 2010) the entire contents of which are incorporated herein by reference.

TECHNICAL FIELD

The present invention relates to a phosphor that emits green fluorescence, and to a light-emitting device that uses the phosphor.

BACKGROUND ART

Nitride and oxynitride phosphors having a stable crystal structure have drawn attention in recant years as phosphors that are excellent in durability and that exhibit little drop in luminance accompanying risos in temperature.

Sialon, which is a solid solution of silicon nitride, is a representative instance of nitride and oxynitride phosphors. Like silicon nitride, sialon has two crystal systems, namely α-type and β-type. As is known, β-type sialon activated with a specific rare earth element exhibits useful fluorescence characteristics, and the use of β-type sialon as a phosphor in white LEDs is under ongoing study.

Patent Document 1 indicates that a phosphor having a main component in the form of p-type sialon containing Eu and represented by formula $Si_{6-x}Al_xO_xN_{8-x}$ is excited over a broad wavelength region, from ultraviolet light to visible light, and emits, with high efficiency, green light having a dominant wavelength ranging from 520 nm or longer to 550 nm or shorter; as a result, the phosphor is excellent as a green phosphor. Patent Document 1 discloses as well various light-emitting elements that rely on this phosphor, singly or in combinations with other phosphors, and indicates that the phosphor can be used particularly appropriately in a white LED having an ultraviolet LED or a blue LED as a light source.

Patent Document 1 discloses a first process of generating β-type sialon containing Eu, and a second process of performing a thermal treatment, at respective optimal temperatures and times, in a nitrogen atmosphere, in vacuum, or in an inert atmosphere having a gas other than nitrogen as a main component.

The effect elicited by relying on these processes is as described above; in particular, it is stated that adopting the second process makes it possible to lower the nitrogen partial pressure in a heating treatment atmosphere, and to break down unstable nitride and oxynitride phases that have a high concentration of crystal defects.

Patent Document 2 discloses a green phosphor having a lowered concentration of oxygen in an oxynitride crystal having a β-type $Si_3N_4$ crystal structure, wherein superior green fluorescence is afforded in that the phosphor emits sharper light, of a narrower peak, than that of conventional sialon phosphors. In particular, Patent Document 2 (Tables 6 and 7) indicates that emission efficiency tends to increase when the Eu concentration is high and the oxygen concentration low in the phosphor (for instance, Examples 21 to 23).

Patent Document 1: WO 2008/062781
Patent Document 2: Japanese Patent Application Publication No. 2008-303331

DISCLOSURE OF THE INVENTION

However, the β-type sialon phosphors disclosed in Patent Documents 1 and 2 were not found to deliver sufficient luminance in practice, and yet better luminance was required from the phosphors. It is thus an object of the present invention to provide a phosphor having enhanced luminance with respect to that of conventional β-type sialon phosphors.

The inventors studied in detail the compositions of produced β-type sialon phosphors, and found as a result that luminance is enhanced in instances where the phosphor composition deviates, by a specific extent, from that in formula $Si_{6-x}Al_xO_xNa_{8-x}$, which is widely used in prior art documents. The inventors found also that luminance in the phosphor is enhanced in cases where Al, O (oxygen) and Eu are present at specific concentrations in the produced β-type sialon phosphor, and perfected the present invention on the basis of the above findings.

Specifically, the gist of the present invention is as set forth in (1) through (9) below:

(1) A β-type sialon phosphor containing Si, Al, O, N and Eu, wherein the Al concentration in the phosphor ranges from 0.80 mass % or higher to 2.25 mass % or lower, the O concentration ranges from 0.36 mass % or higher to 1.15 mass % or lower, the Eu concentration ranges from 0.40 mass % or higher to 0.80 mass % or lower and a ratio (Al/O) of the Al concentration with respect to the O concentration ranges from 2.0 or higher to 3.0 or lower.

(2) The β-type sialon phosphor according to (1), wherein the x value in the CIE color coordinates ranges from 0.335 or greater to 0.365 or smaller, and the y value in the CIE color coordinates ranges from 0.600 or greater to 0.630 or smaller.

(3) The β-type sialon phosphor according to (1) or (2), wherein the Al concentration in the phosphor ranges from 0.90 mass % or higher to 2.25 mass % or lower, and the O concentration is greater than 0.60 mass % and 1.15 mass % or less.

(4) The β-type sialon phosphor according to any one of (1) to (3), wherein the phosphor is produced by way of a thermal treatment process.

(5) The β-type sialon phosphor according to any one of (1) to (4), wherein the phosphor is produced by way of a washing process.

(6) The β-type sialon phosphor according to (5), wherein the phosphor is produced by using, in the washing process, an aqueous solution A of a fluoride that is solid at 20° C. and that has a solubility at 20° C. ranging from 0.01 g/100 ml of water or higher to 400 g/100 ml of water or lower, and an aqueous solution B that comprises at least one inorganic acid other than hydrofluoric acid.

(7) A method for producing the β-type sialon phosphor according to any one of (1) to (6), the method comprising: a step of firing a phosphor starting material in the presence of a compound that comprises carbon and one or more elements selected from the group consisting of Si, Al, Eu and N.

(8) A method for producing the β-type sialon phosphor according to any one of (1) to (6), the method comprising: a step of firing a phosphor starting material in the presence of $SiO_2$.

(9) A light-emitting device, comprising: a first luminous body, and a second luminous body that can emit light through conversion, to visible light, of light from the first luminous body, wherein the second luminous body contains at least the phosphor according to any one of (1) to (6).

The present invention succeeds in providing a phosphor having enhanced luminance with respect to that of conventional β-type sialon phosphors. The present invention succeeds also in providing a high-luminance light-emitting device, by using the above phosphor in a light-emitting device.

BEST MODE FOR CARRYING OUT THE INVENTION

Figure 1:
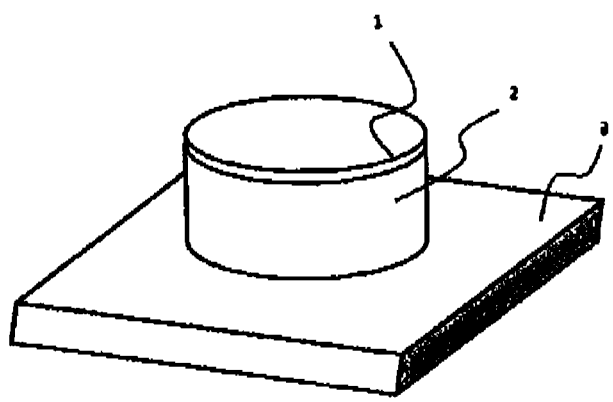
FIG. 1 is a schematic cross-sectional diagram illustrating an embodiment of a light-emitting device of the present invention.

Embodiments of the present invention are explained in detail below, but the present invention is not limited to any of the embodiments, and may be modified in various ways without departing from the scope of the invention.

Each composition formula of the phosphors in this Description is punctuated by a comma (,). Enumerations of a plurality of elements separated by commas (,) denote that one, two or more of the listed elements may be present in arbitrary combinations and compositions. For example, a composition formula, "(Ca,Sr,Ba)Al$_2$O$_4$:Eu", inclusively indicates all of "CaAl$_2$O$_4$:Eu", "SrAl$_2$O$_4$:Eu", "BaAl$_2$O$_4$:Eu", "Ca$_{1-x}$Sr$_x$Al$_2$O$_4$:Eu", "Sr$_{1-x}$Ba$_x$Al$_2$O$_4$:Eu", "Ca$_{1-x}$Ba$_x$Al$_2$O$_4$:Eu" and "Ca$_{1-x-y}$Sr$_x$Ba$_y$Al$_2$O$_4$:Eu" (here, in these formulae, 0<x<1, 0<y<1, 0<x+y<1).

[1. Phosphor]
(Phosphor Composition)

The phosphor of the present invention is a β-type sialon phosphor that contains Si, Al, O, N and Eu, wherein the Al concentration in the phosphor ranges from 0.80 mass % or higher to 2.25 mass % or lower, the O (oxygen) concentration ranges from 0.36 mass % or higher to 1.15 mass % or lower, the Eu concentration ranges from 0.40 mass % or higher to 0.80 mass % or lower and a ratio (Al/O) of the Al concentration with respect to the O (oxygen) concentration ranges from 2.0 or higher to 3.0 or lower.

Ordinarily, β-type sialon is represented by formula Si$_{6-x}$Al$_x$O$_x$N$_{8-x}$, as illustrated for instance in Patent Document 1. That is, the composition of β-type sialon has been regarded as one in which the ratio between Al and O (oxygen) is 1:1.

However, the inventors have reasoned that, in terms of balance of charge, the composition ratio of the constituent elements in the composition of the phosphor has to deviate from the composition represented by the above formula when Eu$^{2+}$ ions, which function as luminescent centers in β-type sialon phosphors, form a solid solution. More detailed assessments of the compositions have revealed that a β-type sialon phosphor exhibits high luminance in a case where Al is present in the form of a solid solution to a greater extent than O (oxygen), more specifically, in a case where the element ratio between Al and O (oxygen) is not 1:1, but instead, the Al concentration in the phosphor ranges from 0.80 mass % or higher to 2.25 mass % or lower, the O concentration ranges from 0.36 mass % or higher to 1.15 mass % or lower and the Eu concentration ranges from 0.40 mass % or higher to 0.80 mass % or lower, and the ratio (Al/O) of the Al concentration with respect to the O concentration ranges from 2.0 or higher to 3.0 or lower.

The inventors speculate that the reason for the enhanced luminance of the β-type sialon phosphor when the composition deviates by a specific extent is as follows.

Among the elements that make up the β-type sialon phosphor, Si has a +4 valence charge, Al a +3 valence charge, N a −3 valence charge and O (oxygen) a −2 valence charge. The total charge in the phosphor (crystal) must be zero, and hence the balance of charge is maintained through changes in the compositions of the Si and N pair and the Al and O (oxygen) pair. Accordingly, it is deemed that composition ratios of Al and O (oxygen) take on identical values, i.e. the element ratio is 1:1. Therefore, the composition of a conventional β-type sialon phosphor is represented by formula Si$_{6-x}$Al$_x$O$_x$N$_{8-x}$ as described above.

However, it is deemed that the charge balance breaks down when Eu$^{2+}$ is present in the form of a solid solution in the crystal of a phosphor having such a composition ratio, and charge tends to be rebalanced in the crystal as a whole in that Si and Al compensate for the +2 valence charge fraction introduced by Eu. In the abovementioned conventional composition ratio, charge balancing is not thorough, Eu$^{2+}$ does not readily form a solid solution in the crystal, and the phosphor becomes chemically unstable.

In order to cause Eu$^{2+}$ to form a solid solution in the crystal of a β-type sialon phosphor, it is thus found that prescribing a −2 valence overall for a composition in which Si$^{+4}$ is decreased by two atoms and Al$^{3+}$ is increased by two atoms, so as to offset a solid solution of one Eu$^{2+}$ atom, would be a good approach in terms of maintaining charge balance.

Therefore, it is deemed that a composition such as the one described below, i.e. a composition that deviates from the phosphor composition disclosed in prior art documents and that is represented by formula Si$_{6-x}$Al$_x$O$_x$N$_{8-x}$, may enable Eu$^{2+}$ to form a solid solution more readily, while maintaining charge balance, such that luminance is enhanced as a result.

In the present invention, the Eu concentration and oxygen concentration in the phosphor lie within specific ranges, and the Al concentration lies also within a specific range. It is found that, as a result, charge balance is maintained readily, being particularly good around Eu, and that luminance is thus enhanced.

The composition of the phosphor of the present invention is explained in detail below.

The Al concentration in the phosphor of the present invention ranges from 0.80 mass % or higher to 2.25 mass % or lower. Preferably, the lower limit value is 0.90 mass % or higher, more preferably 1.00 mass % or higher, yet more preferably 1.10 mass % or higher, and particularly preferably 1.50 mass % or higher. Preferably, the upper limit value is 2.20 mass % or lower, more preferably 2.10 mass % or lower, yet more preferably 1.80 mass % or lower, and particularly preferably smaller than 1.70 mass %. If the Al concentration lies within the above ranges, charge compensation of Eu, which is the activating element, is accomplished appropriately, and an impurity phase can be reduced. Therefore, it becomes possible to enhance emission characteristics. If the Al concentration is excessively high, unreacted AlN and the like tend to remain, and emission characteristics tend to be worse. If the Al concentration is excessively low, charge compensation of Eu is insufficient, Eu content in the phosphor tends to decrease, and emission characteristics tend to be worse.

The O (oxygen) concentration in the phosphor of the present invention ranges from 0.36 mass % or higher to 1.15 mass % or lower. Preferably, the lower limit value is greater than 0.60 mass %, and is more preferably 0.65 mass % or higher, and yet more preferably 0.7 mass % or higher; preferably, the upper limit value is 1.10 mass % or lower, and more preferably 1.05 mass % or lower. It O (oxygen) lies within the above range, phosphor particles grow sufficiently, and emission characteristics can be achieved as required for industrial practice. If the O (oxygen) concentration is excessively low, particles may fail to grow, and omission characteristics tend to be worse. If the O (oxygen) concentration is excessively high, the obtained phosphor particles tend to be smaller, and emission characteristics tend to be worse.

The Eu concentration in the phosphor of the present invention ranges from 0.40 mass % or higher to 0.80 mass % or lower. Preferrably, the lower limit value is 0.45 mass % or higher, and more preferably 0.50 mass % or higher. Preferably, the upper limit value is 0.75 mass % or lower, more preferably 0.70 mass % or lower, and particularly preferably 0.65 mass % or lower. If Eu lies within the above ranges, emission characteristics can be achieved as required for industrial practice. If the Eu concentration is excessively low, it is difficult to achieve wavelength conversion through sufficient absorption of excitation light, and emission characteristics tend to be worse on account of so-called luminance saturation. If the Eu concentration is excessively high, the emission characteristics tend to be worse on account of concentration quenching arising from the Eu concentration.

If the concentrations of Al, O (oxygen) and Eu in the phosphor of the present invention do not satisfy the above ranges, the luminance of the obtained phosphor tends to be worse.

The Si concentration in the phosphor of the present invention ranges preferably from 56.0 mass % or higher to 61.0 mass % or lower. The N (nitrogen) concentration in the phosphor of the present invention ranges from 37.0 mass % or higher to 41.0 mass % or lower.

A characterizing feature of the phosphor of the present invention is that, in addition to satisfying the various concentration requirements of Al, O (oxygen) and Eu, as described above, the ratio (Al/O) of Al concentration with respect to the O (oxygen) concentration ranges from 2.0 or higher to 3.0 or lower. If the value of Al/O lies within the above range, charge can as a result be balanced appropriately throughout the entire crystal, crystal growth is promoted, and the phosphor exhibits high luminance. Preferably, the lower limit value is greater than 2.0, and is more preferably 2.1 or higher, yet more preferably 2.2 or higher, and particularly preferably 2.3 or higher. Preferably, the upper limit value is 2.9 or lower, more preferably 2.8 or lower, and particularly preferably 2.5 or lower.

If the value of Al/O is smaller than 2.0, there is excessive oxygen with respect to the amount of Eu in solid solution; as a result, for instance, residual $Al_2O$ remains in a case where $Al_2O_3$ is used as a starting material, and, accordingly, an oxynitride impurity remains in the glass phase, and the emission characteristics of the phosphor tend to be worse. If the value of Al/O exceeds 3.0, there is excessive aluminum with respect to the amount of Eu in solid solution; as a result, for instance, residual AlN remains in a case where AlN is used as a starting material, and, accordingly, an oxynitride impurity remains in the glass phase, and the emission characteristics of the phosphor tend to be worse.

As described above, luminance tends to increase when the O (oxygen) concentration in the phosphor is greater than 0.6 mass %. Therefore, a preferred β-type sialon phosphor as the phosphor of the present invention is a β-type sialon phosphor that contains Si, Al, O, N and Eu, such that the Al concentration in the phosphor ranges from 0.9 mass % or higher to 2.25 mass % or lower, the O concentration is greater than 0.60 mass % and 1.15 mass % or lower, the Eu concentration ranges from 0.4 mass % or higher to 0.8 mass % or lower, and the ratio (Al/O) of the Al concentration with respect to the O concentration ranges from 2.0 or higher to 3.0 or lower.

As described below, a phosphor having an appropriate charge balance can be obtained, also when the Al concentration in the phosphor ranges from 0.80 mass % or higher to 1.00 mass % or lower and the O (oxygen) concentration ranges from 0.36 mass % or higher to 0.60 mass % or lower, when the phosphor starting material is fired in the presence of a compound that comprises carbon and one or more elements selected from the group consisting of Si, Al, Eu and N.

In the present invention, the O (oxygen) concentration can be measured using an oxygen-nitrogen spectrometer such as model TC600, by LECO. The oxygen concentration can be measured in accordance with an inert gas Lusion-TR absorption method.

The Al concentration and Eu concentration can be measured by ICP emission spectroscopy using for instance an instrument ULTTMA2C by Iloriba.

A desired value of the respective concentrations of Al, O (oxygen) and Eu in the phosphor of the present invention can be achieved by adjusting the charging ratio of the phosphor starting materials, and by mixing thoroughly the charging starting materials in the phosphor production process, specifically by lengthening the mixing Lime or performing mixing over a plurality of times.

[Phosphor Characteristics]

(Emission Peak Wavelength)

The phosphor obtained in accordance with the present invention is excited by light ranging from 200 nm or longer to 530 nm or shorter. The emission peak wavelength of the phosphor is ordinarily 510 nm or longer, preferably 520 nm or longer, and is ordinarily 560 nm or shorter, preferably 550 nm or shorter.

(Quantum Efficiency)

The higher the internal quantum efficiency of the phosphor obtained in accordance with the present invention, the more preferable the phosphor is. The value of internal quantum efficiency is ordinarily 60% or higher, and preferably 70% or higher.

The higher the absorption efficiency of the phosphor obtained in accordance with the present invention, the more preferable the phosphor is. The value of absorption efficiency is ordinarily 60% or higher, and preferably 65% or higher. Low absorption efficiency Lends to result in lower emission efficiency.

The higher the external quantum efficiency of the phosphor obtained in accordance with the present invention, the more preferable the phosphor is. The value of external quantum efficiency is ordinarily 40% or higher, preferably 45% or higher and more preferably 50% or higher. Low external quantum efficiency tends to result in lower emission efficiency.

The internal quantum efficiency, external quantum efficiency and absorption efficiency can be measured in accordance with the methods set forth in the examples below.

(Size of Primary Particles)

The phosphor of the present invention has a specific composition by virtue of which growth of crystal particles is promoted, and hence the primary particles tend to be large. Herein, "primary particles" denote particles such that interfaces between particles can be clearly observed, and exclude particles that result from aggregation of a plurality of primary particles.

Specifically, particles having a thickness (minor axis) of primary particles of 4 μm or larger are ordinarily 35 number % or more, preferably 40 number % or more, more preferably 50 number % or more, and particularly preferably 60 number % or more, of the total. Ideally, particles having a thickness of primary particles of 4 μm or larger would preferably be 100% of the particles. Particles having a large primary particle thickness tend to exhibit high absorption efficiency towards excitation light and to exhibit brighter luminance. The upper limit of the thickness of the primary particles is not particularly limited, but is ordinarily 50 μm or less, preferably 25 μm or less, from the viewpoint of handleability.

The ratio of particles having a thickness of primary particles of 4 μm or larger is determined through a measurement of the minor axes of 80 or more particles that are randomly selected in five fields of view of micrograph (for instance, at 1000 magnifications).

The thickness (minor axis) of the primary particles can be brought to lie within the above range for instance by firing the phosphor starting material in the presence of $SiO_2$. That is because causing $SiO_2$ to be present during firing elicits smooth migration of the various constituent elements of the phosphor during the firing process, and promotes particle growth in the phosphor.

(Aspect Ratio of Primary Particles)

The aspect ratio of the primary particles of the phosphor of the present invention is one of the characterizing features of the phosphor. Specifically, primary particles having an aspect ratio of 2.0 or greater make up ordinarily 75 number % or more, preferably 80 number % or more, and more preferably 90 number % or more, of the total.

In a phosphor comprising numerous needle-like particles having an aspect ratio value of 2.0 or greater, the phosphor can be applied, with good orientation of the particles in the longitudinal direction, upon application of the phosphor-containing composition that is mixed with a liquid medium.

The ratio of particles having an aspect ratio of 2.0 or greater can be worked out by selecting randomly 80 or more particles from five fields of view of the particles, measuring the major axes and the minor axes of the particles, computing the aspect ratio as the value of major axis/minor axis, and calculating the proportion of particles having an aspect ratio of 2.0 or greater.

(Thickness, Length and Aspect Ratio of Primary Particles)

The thickness (minor axis), length (major axis) and aspect ratio of the primary particles of the phosphor of the present invention are also characterizing features of the phosphor. Specifically, primary particles having a thickness of 4 μm or larger and a length of 50 μm or smaller and wherein a same-particle aspect-ratio is 2.0 or greater, make up ordinarily 26 number % or more, preferably 50 number % or more, and more preferably 75 number % or more, of the total.

Specifically, primary particles having a thickness of 4 μm or larger and a length of 50 μm or smaller and wherein a same-particle aspect-ratio is 3.0 or greater, make up ordinarily 10 number % or more, preferably 30 number % or more, and more preferably 50 number % or more, of the total.

A phosphor that comprises numerous needle-like primary particles having a thickness of 4 μm or larger and an aspect ratio value of 2.0 or greater can deliver the luminance that is required in practice, and can be applied, with good orientation of the particles in the longitudinal direction, upon application of the phosphor-containing composition that is mixed with a liquid medium. However, a disperser tends to become clogged if the length of the primary particles is excessive, and hence the length of the primary particles is ordinarily 50 μm or smaller, and preferably 40 μm or smaller.

The above-described ratio is worked out by selecting randomly 80 or more particles in five fields of view in micrographs, measuring the major axes and the minor axes of the primary particles, calculating the aspect ratio in the form of the value of major axis/minor axis, wherein the minor axis is the thickness and the major axis is the length, and calculating the proportion of primary particles that satisfy the respective conditions.

(Weight-Average Median Diameter D50 and Standard Deviation)

The weight-average median diameter D50 and the standard deviation thereof are values relating to particle diameter.

In the present invention, the weight-average median diameter D50 (hereafter also referred to as "median diameter D50") is defined as follows.

The median diameter D50 is a value worked out on the basis of a weight-basis particle size distribution curve that is obtained by measuring a particle size distribution in accordance with a laser diffraction/scattering method. Specifically, the phosphor is dispersed in an aqueous solution that comprises a dispersant. The median diameter D50 can then be obtained through measurement using a laser diffraction particle size analyzer (LA-300, by HORIBA, Ltd.) within a particle diameter range from 0.1 μm or greater to 600 μm or shorter. The median diameter D50 refers to the particle diameter value for a cumulative value of 50% in the weight-basis particle size distribution curve. Similarly, the particle diameter values for cumulative values of 25% and 75% In the weight-basis particle size distribution curve are expressed as D25 and D75.

The median diameter D50 of the phosphor of the present invention is ordinarily 1 μm or greater, preferably 5 μm or greater, and is ordinarily 50 μm or smaller, preferably 30 μm or smaller. Preferably, a particle diameter ranging from 5 μm or greater to 15 μm or smaller is selected, when emphasis is laid on handleability, and particularly preferably from 15 μm or greater to 25 μm or smaller when luminance of the phosphor itself is emphasized, in accordance with, among others, the intended use, the phosphors that are combined, and the configuration of the device that is used.

(CIF Color Coordinates)

The emission color of the phosphor of the present invention exhibits an x value, in CIE color coordinates, that is ordinarily 0.335 or greater, preferably 0.340 or greater, yet more preferably 0.345 or greater, and that is ordinarily 0.365 or smaller, preferably 0.360 or smaller and yet more preferably 0.355 or smaller. If the x value is excessively small, the emission color tends to be greenish, and luminance tends to drop. If the x value is excessively large, the emission color tends to be yellowish, and the color reproduction range tends to become narrower.

The emission color of the phosphor of the present invention exhibits an y value, in CIE color coordinates, that is ordinarily 0.600 or greater, 0.605 or greater, yet more preferably 0.610 or greater, and that is ordinarily 0.630 or smaller, preferably 0625 or smaller and yet more preferably 0.620 or smaller. If the y value is excessively small, the color reproduction range tends to become narrower. If the y value is excessively large, luminance tends to drop.

[2. Phosphor Production Method]

(Charging Composition of the Phosphor Starting Material)

The β-type sialon phosphor can be produced by firing a mixture of phosphor starting materials that is prepared so as to yield a composition wherein Eu is added to the composition represented by $Si_{6-x}Al_xO_xN_{8-x}$ set forth in Patent Document 1, i.e. in such a manner that the composition ratio of Al and the composition ratio of O (oxygen) are identical.

In the present invention, however, the phosphor starting material is preferably charged and mixed in such a manner that the composition ratio of Al is greater than the composition ratio of O (oxygen). Preferably, the phosphor is produced by preparing a mixture through charging and mixing phosphor starting materials in such a way so as to yield the composition ratio represented by formula (1) below, and by firing then the resulting mixture. The composition ratio of O (oxygen) in formula (1) includes the amount of oxygen comprised in the Si source, the Al source and the Eu source.

$$Si_aAl_bO_cN_d:Eu_e \qquad (1)$$

In formula (1), a, b, c, d and e satisfy $5.65 \leq a \leq 5.95$, $0.10 \leq b \leq 0.35$, $0.01 \leq c \leq 0.12$, $7.80 \leq d \leq 7.99$, $0.007 \leq e \leq 0.020$, and $b > c$. A phosphor having the composition of the present invention can be readily obtained by mixing the charging composition of the phosphor starting materials so as to yield such a composition ratio. Preferably, a, b, c, d and e satisfy $5.65 \leq a \leq 5.95$, $0.10 \leq b \leq 0.30$, $0.015 \leq c \leq 0.12$, $7.80 \leq d \leq 7.98$, $0.007 \leq e \leq 0.019$, and $b > c$, and more preferably, a, b, c, d and e satisfy $5.70 \leq a \leq 5.90$, $0.15 \leq b \leq 0.25$, $0.02 \leq c \leq 0.10$, $7.83 \leq d \leq 7.95$, and $0.012 \leq e \leq 0.018$.

Metal compounds are ordinarily used as the phosphor starting materials. Specifically, the phosphor can be produced by weighing metal compounds so as to achieve a prescribed composition, and mixing the metal compounds, followed by firing. In the case of the phosphor represented by formula (1), for instance, the phosphor can be produced by mixing (mixing process) a required combination from a Si starting material, (hereafter, "Si source" as appropriate), an Al starting material (hereafter "Al source" as appropriate) and an Eu starting material (hereafter, "Eu source" as appropriate), firing then the obtained mixture (firing process), and washing (washing process) the obtained fired product, as the case may require.

(Phosphor Starting Materials)

Known phosphor starting materials can be used in order to produce the phosphor of the present invention. For instance, there can be used silicon nitride ($Si_3N_4$), aluminum nitride (AlN), silicon oxide ($SiO_2$) and/or aluminum oxide ($Al_2O_3$), as well as an Eu compound selected from among an Eu metal, oxide, carbonate, chloride, fluoride, nitride or oxynitride. Metallic Si can be used as the Sj source, but in that case the oxygen concentration in the phosphor Lends to decrease. Therefore, silicon nitride ($Si_3N_4$) is preferably used in the present invention.

The O (oxygen) and N (nitrogen) in the formula (1) may be supplied from the Si source, the Al source or the Eu source, and N (nitrogen) may be supplied from the firing atmosphere. The various starting materials may include unavoidable impurities.

(Mixing Process)

The phosphor starting materials are weighed to obtain the target composition, and are thoroughly mixed using a ball mill or the like, to yield a phosphor starting material mixture (mixing process). In the present invention, thorough mixing is preferably performed in such a manner that the constituent elements (in particular, Eu, which is the activating element) are distributed homogeneously.

The balance of charge breaks down if Eu forms a solid solution in the crystal, as described above. Charge in the crystal as a whole can be conceivably balanced by Si and Al, to offset the +2 valence fraction from Eu. If $Si^{14}$ decreases by two atoms and $Al^{3+}$ increases by two atoms, −2 valence state is obtained overall and the $Eu^{2+}$ solid solution can be counterbalanced. In that approach, preferably, Al and Eu are present close to each other in the phosphor starting material mixture, such that $Al^{3+}$ and $Eu^{2+}$ are close to each other when forming a solid solution in the crystal.

As a result of thorough mixing, Eu becomes homogeneously distributed in the phosphor starting material mixture; thereby, uneven distribution of Al and Eu is mitigated, and $Eu^{2+}$ and Al are distributed homogeneously upon firing. It is deemed that, as a result, charge in the crystal can be balanced more readily when Eu forms a solid solution in the form of $Eu^{2+}$ in the crystal of the phosphor, and luminance is accordingly enhanced.

In the case of non-uniform mixing, where the Al compound is not present close to Eu but is present in an unevenly distributed state, it is found that Al fails to reach the vicinity of Eu, despite ion diffusion during firing, and charge balance cannot be maintained. If the balance of charge cannot be maintained, a solid solution of $Eu^{2+}$ ions does not form readily in the crystal, and hence the required emission characteristics, such as absorption efficiency of excitation light and emission luminance tend to worsen upon practical realization of the phosphor in a light-emitting device. By contrast, a phosphor that contains a charge-balanced crystal is chemically more stable and exhibits superior emission characteristics.

The mixing method is not particularly limited, but specifically the below-described methods (A) and (B) may be resorted to.

(A) Dry mixing method in which the above-described phosphor starting materials are pulverized and mixed by combining pulverization using for instance a dry pulverizer such as a hammer mill, a roll mill, a ball mill, a jet mill, a vibratory mill or the like, or mortar and pestle, and mixing using a mixer such as a ribbon blender, a V blender, a Henschel mixer, a rocking mixer or the like, or using a mortar and pestle.

(B) Wet mixing method in which a solvent such as water or a dispersion medium is added to the above-described phosphor starting materials, and the whole is mixed using, for instance, a pulverizer, mortar and pestle, an evaporating dish or a stirring bar, to yield a solution or slurry that is then dried by spray drying, heating drying, natural drying or the like.

Mixing of the phosphor starting materials may be accomplished in accordance with a wet mixing method or a dry mixing method. Those include, for instance, a dry mixing method or wet mixing method that utilizes a nonaqueous solvent, in order to avoid contamination of the phosphor starting materials by moisture, or dry mixing wherein phosphor starting material components that are stable in water are firstly wet-mixed in an water-soluble solvent, the mixture is then dried, and, thereafter, starting material components that are unstable in water are further added, whereupon the whole is dry-mixed.

In order to sufficiently mix the phosphor starting materials in the case of the (A) method, mixing proceeds preferably for a Lime that exceeds at least 60 minutes, more preferably 90 minutes or more, and yet more preferably 120 minutes or more. Preferably, mixing is performed in accordance with a mixing method that involves two-stage mixing and pulverization. In the case of mixing according to method (B), a solution or a slurry is preferably mixed for at least 60 minutes. A preferred mixing method in order to mix thoroughly Eu, which is the activating element, into the starting materials, involves herein dispersing a water-soluble Eu compound, for instance a carbonate, a nitrate, a sulfate, a chloride or the like, in water, followed by mixing with the other phosphor starting materials.

(Firing Process)

The starting material mixture obtained in the mixing process is then fired (firing process). The above-described phosphor starting material mixture is dried, as the case may require, and is thereafter filled into a container, for instance a crucible or the like, such that at least the face of the container that comes into contact with the starting material comprises boron nitride. Firing is performed then using a firing furnace, a pressurized furnace or the like.

The firing temperature varies depending on the composition of the desired phosphor, and cannot be prescribed categorically, but ordinarily stable phosphors are obtained in a temperature range from 1820° C. or higher to 2200° C. or lower. If the firing temperature is 1820° C. or higher, Eu can be taken up into the β-type sialon crystal, and a phosphor is obtained that has sufficient luminance. In industrial terms, the heating temperature is preferably not higher than 2200° C., since in that case it is not necessary to suppress decomposition of the β-type sialon by applying a very high nitrogen pressure, and, accordingly, no special equipment is required to that end.

The firing temperature is preferably 1850° C. or higher, particularly preferably 1900° C. or higher, and preferably 2200° C. or lower, and particularly preferably 2100° C. or lower. The firing atmosphere in the firing process may be any atmosphere so long as the phosphor of the present invention can be obtained, but is ordinarily a nitrogen-containing atmosphere. Specific examples include, for instance, a nitrogen atmosphere and a hydrogen-containing nitrogen atmosphere, preferably a nitrogen atmosphere.

The oxygen content in the firing atmosphere may be ordinarily 10 ppm or less, preferably 5 ppm or loss. The temperature rise rate is ordinarily 2° C./minute or higher, preferably 3° C./minute or higher, and ordinarily 10° C./minute or lower, preferably 5° C./minute or lower. A temperature rise rate within the above ranges is preferred in that, in that case, it becomes possible to prevent the firing time from dragging excessively.

The firing time varies depending on the temperature, pressure and so forth during firing, but is ordinarily 10 minutes or more, preferably 1 hour or more, and ordinarily 24 hours or less, preferably 12 hours or less. The pressure during firing varies depending on, for instance, the firing temperature, but is ordinarily 0.1 MPa or higher, preferably 0.5 MPa or higher, and, as an upper limit, is ordinarily 2.0 MPa or lower, preferably 1.5 MPa or lower. From the viewpoint of industrial convenience, in terms of cost and labor, the pressure ranges preferably from about 0.6 MPa or higher to 1.2 MPa or lower.

Preferably, $SiO_2$ is present during firing of the phosphor starting materials. It is found that causing $SiO_2$ to be present during firing elicits smooth migration of the various constituent elements of the phosphor during the firing process, and promotes particle growth in the phosphor. It is deemed that, a result, the absorption efficiency of the phosphor is enhanced, and luminance is likewise enhanced. It is found that that Eu in particular, which is the activating element, migrates smoothly during the firing process, and hence it becomes possible to promote homogeneous dispersion of the activating element in the phosphor particles, to suppress concentration quenching derived from segregation of the activating element, and to enhance the internal quantum efficiency of the phosphor, so that luminance is enhanced as a result.

A method for causing $SiO_2$ to be present during firing may involve mixing $SiO_2$ together with the starting materials, or adding $SiO_2$ during the firing process. The type of $SiO_2$ that is used in the production method of the present invention is not particularly limited, and for instance spherical microparticulate silica can be used. Preferably, there is used $SiO_2$ having few impurities, and preferably, the $SiO_2$ that is used has for instance a Fe content 10 ppm or less.

The particle diameter of $SiO_2$ is ordinarily 200 nm or greater, preferably 500 nm or greater, more preferably 1 μm or greater, and ordinarily 10 μm or smaller, preferably 5 μm or smaller and more preferably 3 μm or smaller. If the particle diameter is excessively large, the effect of promoting particle growth tends not to pervade throughout, particle variability to be substantial, and luminance to drop. If the particle diameter is too small, $SiO_2$ particles tend to aggregate with one another, and workability tends to drop. Also, the effect of promoting particle growth tends not to pervade throughout, particle variability tends to be substantial, and luminance to drop.

The addition amount of $SiO_2$ is ordinarily 0.01 weight % or greater, preferably 0.1 weight % or greater, more preferably 0.2 weight % or greater and ordinarily 2.8 weight % or smaller, preferably 2 weight % or smaller, more preferably 1.2 weight % or smaller, yet more preferably 0.8 weight % or smaller and particularly preferably 0.4 weight % or smaller, with respect to the total fired product (total of the phosphor starting materials plus $SiO_2$). If the addition amount is excessive, sintering tends to be excessive and melting to occur, and the phosphor tends to undergo severe aggregation, all of which may render the phosphor difficult to be used as a phosphor powder for LEDs. If the addition amount is excessively small, the effect of promoting particle growth tends not to be elicited throughout, the particles tend to exhibit significant variability in size, and luminance to drop.

A compound (hereafter also referred to as "compound comprising carbon") that comprises carbon and one or more elements selected from the group consisting of Si, Al, Eu and N may be present during firing of the phosphor starting material. In the particular case of producing a phosphor having a low Al concentration, firing is preferably performed in the presence of the abovementioned compound comprising carbon, since doing so affords the effect of removing excess oxygen that is necessarily comprised in the starting materials; in turn, this removal of excess oxygen has the effect of preventing melting of the phosphor particles, preventing the phosphor particles from becoming thinner, and increasing emission characteristics.

Examples of the compounds comprising carbon include, for instance, SiC, $Al_4C_3$ and the like. Among the foregoing, SiC is preferred on account of its good workability and being stable in atmospheric air.

In a case where SiC is used as the compound comprising carbon, the method for incorporating SiC during firing may involve mixing SiC together with the starting materials, or adding SiC in the firing process. The type of SiC that is used in the production method of the present invention is not particularly limited, but, preferably there is used SiC having few impurities, and preferably, the SiC that is used has fox instance a Fe content 10 ppm or less.

The particle diameter of SiC is ordinarily 100 nm or greater, preferably 200 nm or greater, more preferably 500 nm or greater and ordinarily 10 μm or smaller, preferably 5 μm or smaller and more preferably 3 μm or smaller. If the particle diameter of the SiC that is used is excessively large, the SiC does not react properly with oxygen in the starting materials, and residual excess oxygen is likely to remain; also, the particles of the obtained phosphor tend to be finer, and the emission characteristics to be worse as a result. If the particle diameter is excessively small, SiC particles aggregate with one another, and workability tends to be impaired. Also, the effect of removing excess oxygen tends not to be elicited throughout the SiC, the particles tend to exhibit size variability, and the luminance of the obtained phosphor tends to drop.

The addition amount of SiC is ordinarily 0.01 weight % or greater, preferably 0.1 weight % or greater, more preferably 0.2 weight % or greater, and ordinarily 2 weight % or smaller, preferably 1.5 weight % or smaller and more preferably 1.2 weight % or smaller, with respect to the total fired product (total of the phosphor starting materials plus SiC). If the addition amount is excessively large, the oxygen removal effect tends to be too pronounced, particle growth does not proceed readily, Al and/or Eu do not diffuse readily in the phosphor, and charge balance tends to be improper. The emission characteristics of the phosphor may be impaired as a result. If the addition amount is excessively small, excess oxygen gives rise to severe phosphor aggregation, and the workability of the phosphor as a phosphor for LEDs is lost. Moreover, the obtained phosphor particles are extremely fine, and hence the emission characteristics may be significantly impaired.

Firing may take place in the presence of both $SiO_2$ and SiC.

The obtained fired product is in the form of granules or lumps. The fired product undergoes a combination of crushing, pulverization and/or sorting operations, to be rendered into a powder of specific size. Herein, the fired product may be treated so as to yield a D50 of about 30 μm or less.

An example of a concrete treatment may involve sifting and sorting an admixture using a mesh of about 45 μm, and feeding the sifted powder to a next process, or a method wherein the product is pulverized to a specific granularity by using ordinary pulverization equipment in the form of, for instance, a ball mill, a vibratory mill, a jet mill or the like. In the latter method, excessive pulverization results not only in the formation of microparticles that scatter light readily, but also in crystal defects on the particle surface, all of which may impair emission efficiency.

(Thermal Treatment Process)

In order to produce the phosphor of the present invention, the phosphor obtained in the firing process is preferably subjected to a thermal treatment (thermal treatment process), for the purpose of thermally decomposing the oxynitride impurity phase. When the thermal treatment process is performed, ions such as Eu, which are unevenly distributed in the phosphor, diffuse more readily, and it becomes possible to promote thermal decomposition of the impurity phase that is formed on the surface of the phosphor during the firing process, and to enhance luminance.

An appropriate thermal treatment temperature in the thermal treatment process varies depending on the atmosphere and other factors, but ranges preferably from 1200° C. or higher to 1550° C. or lower. The impurity phase tends to decompose at a temperature of 1200° C. or higher, whereas rapid decomposition of the β-type sialon can be suppressed if the temperature is 1550° C. or lower.

Examples of the atmosphere for thermal treatment include, for instance, a nitrogen atmosphere, a hydrogen-containing nitrogen atmosphere, an argon atmosphere, a hydrogen-containing argon atmosphere or a vacuum atmosphere, preferably an argon atmosphere.

The pressure during the thermal treatment varies depending on the thermal treatment temperature and other factors, but is ordinarily 0.09 MPa or higher, preferably 0.1 MPa or higher, and, as an upper limit, is ordinarily 1 MPa or lower, preferably 0.5 MPa or lower.

The thermal treatment time varies depending on, for instance, the temperature and pressure during the thermal treatment, but is ordinarily 10 minutes or more, preferably 1 hour or more, and ordinarily 24 hours or less, preferably 12 hours or less.

The firing process and the thermal treatment process may be performed in succession during cooling after heating in the above-described firing process, but it is more effective to perform the thermal treatment after adjustment to a specific granularity. That is because doing on so allows removing not only crystal defects that are formed during firing, but also crystal) defects that are formed during crushing or pulverization.

(Washing Step)

The β-type sialon phosphor exhibits a tendency whereby metallic Si forms on the surface of the phosphor as a result of thermal decomposition during the firing process and the thermal treatment process. The metallic Si must be removed to the greatest possible extent in order to improve the characteristics of the phosphor. Preferably, a washing process is included to that end after the firing process and the thermal treatment process. The washing process allows removing metallic Si and an impurity phase, other than metallic Si, that form on the surface of the phosphor as a result of the firing process and the thermal treatment process. This elicits the effect of reducing the extent of component that absorbs light emitted by the phosphor, and of enhancing thus emission characteristics.

The washing method in the present invention is not particularly limited, so long as the method allows impurities to be removed, and may involve, for instance, washing using hydrofluoric acid and nitric acid. In terms of safety and environmental impact, however, washing may be performed using the below-described aqueous solution A and aqueous solution B.

The aqueous solution A is an aqueous solution that comprises a fluoride that is solid at 20° C. and that has a solubility ranging from 0.01 g/100 ml of water or higher to 400 g/100 ml of water or lower at 20° C. The aqueous solution B is an aqueous solution that comprises at least one acid selected from the group consisting of nitric acid, sulfuric acid, hydrochloric acid, oxalic acid and phosphoric acid. Specifically, hydrofluoric acid and nitric acid are conventionally used as components of the mixed acid that is utilized in the washing process. In the present invention, however, there are preferably used for instance nitric acid and an aqueous solution of sodium fluoride (stable solid having a melting point of 993° C.), in order to reduce the use amount of hydrofluoric acid, which is an acutely toxic substance. As a result, it becomes possible to remove safely and effectively impurities that include the above-described metallic Si, and to enhance the yield of the washing process, all of which makes for better industrial convenience.

Compared with hydrofluoric acid, the aqueous solution A that is used in the present invention is safer for humans, has a smaller environmental impact, and can be handled more easily in operations such as storage and transportation.

The solubility at 20° C. of the fluoride comprised in the aqueous solution A is preferably 0.1 g/100 ml of water or higher, more preferably 0.5 g/100 ml of water or higher, and preferably 100 g/100 ml of water or lower. Such a fluoride is solid at normal temperature, and hence has good handleability and workability, and allows for safe production operations. The aqueous solution A comprising such a fluoride is corrosive towards impurities such as Si, $SiO_2$ and the like, and hence the solution can remove these compounds on its own. However, the above-described aqueous solution A tends to have difficulty in removing by itself impurities such as Si, $SiO_2$ and the like in cases where a film of an oxynitride impurity phase is formed. Therefore, the oxynitride impurity phase can be removed, and impurities such as Si and $SiO_2$ can be removed efficiently, by concomitantly using the aqueous solution A and also the aqueous solution B that comprises at least one acid selected from the group consisting of nitric acid, sulfuric acid, hydrochloric acid, oxalic acid and phosphoric acid.

Concrete examples of the fluoride that can be used in the aqueous solution A include, for instance, LiF, NaF, KF, RbF, CsF, $NH_4F$, $NaHF_2$, $KHF_2$, $RbHF_2$, $NH_5F_2$, $AlF_3$, $ZnF_2.4H_2O$, $ZrF_4$, $Na_2TiF_6$, $K_2TiF_6$, $(NH_4)_2TiF_6$, $Na_2SiF_6$, $K_2SiF_6$, $ZnSiF_6.6H_2O$, $MgSiF_6.6H_2O$, $Na_2ZrF_6$, $K_2ZrF_6$, $(NH_4)_2ZrF_6$, $KBF_4$, $NH_4BF_4$, $Mg(BF_4)_2.6H_2O$, $KPF_6$, $K_3AlF_6$, $Na_3AlF_6$, $SrF_2$ and the like. Preferred among the foregoing is NaF, on account of its moderately high solubility and low deliquescence.

Acids that can be used as the aqueous solution B include inorganic acids other than hydrofluoric acid, specifically, for instance at least one acid selected from the group consisting of nitric acid, sulfuric acid, hydrochloric acid, oxalic acid and phosphoric acid (hereafter, these acids will be referred to as "inorganic acid of the aqueous solution R"). Nitric acid is preferred among the foregoing on account of its high oxidizing power.

The concentration of the inorganic acid in the aqueous solution R is ordinarily 10 weight % or higher, preferably 15 weight % or higher, more preferably 20 weight % or higher, and ordinarily 70 weight % or lower, with respect to the total amount of the aqueous solution A and the aqueous solution B. The concentration of the inorganic acid in the aqueous solution B is not particularly limited, so long as the concentration of the inorganic acid in the aqueous solution B with respect to the total amount of the aqueous solution A plus the aqueous solution B lies within the above ranges, and there can be used dilute nitric acid as well as concentrated nitric acid.

A preferred combination of the aqueous solution A and the aqueous solution B is a combination of NaF and nitric acid. A dissolution treatment using such a mixed aqueous solution is preferred since in that case Si can be removed quickly and the characteristics of the phosphor can be enhanced, and workability and industrial convenience are likewise enhanced while reducing environmental impact.

The washing process in the present invention is performed through immersion of the phosphor obtained in the firing process in a mixed solution of the aqueous solution A and the aqueous solution B. The mixing method herein is not particularly limited, so long as the aqueous solution A and the aqueous solution B can be combined, and may involve adding the aqueous solution B to the aqueous solution A, or adding the aqueous solution A to the aqueous solution B.

The phosphor may be left to stand while immersed, but from the viewpoint of operational efficiency, the mixed solution is preferably stirred so as to shorten the washing time. Operations are ordinarily carried out at room temperature (about 25° C.), but the aqueous solutions may be heated as the case may require.

The time during which the phosphor is immersed in the mixed solution of the aqueous solution A and the aqueous solution B varies depending on, for instance, the stirring conditions, but is ordinarily 1 hour or more, preferably 2 hours or more, and ordinarily 24 hours or less, preferably 12 hours or less.

In the washing process of the present invention, preferably, washing with ordinary water and filtering are performed after the operation of immersing the phosphor in the mixed solution of the aqueous solution A and the aqueous solution B. Water at room temperature (about 25° C.) is ordinarily used as the washing medium in water washing, but the water may be heated as the case may require.

The above-described water washing of the phosphor is performed until the electrical conductivity of a supernatant that forms in a water dispersion test that is performed on the phosphor after washing, such as the one described below, is equal to or smaller than a specific value. Specifically, the phosphor after washing is crushed or pulverized, as the case may require, for instance in a dry-type ball mill, is granulated to a desired weight-average median diameter through sorting by sitting or elutriation, and, thereafter, the phosphor is dispersed through stirring over a predetermined time, for instance 10 minutes, in a volume of water equivalent to 10 times the weight of the phosphor, and is thereafter left to stand for 1 hour, to elicit as a result natural sedimentation of phosphor particles having a greater specific gravity than that of water. The electrical conductivity of the supernatant at this time is measured, and the above-described washing operation is repeated, as needed, until the electrical conductivity of the supernatant is ordinarily 100 μS/cm or lower, preferably 50 μS/cm or lower, and most preferably 10 μS/cm or lower.

The water that used in the water dispersion test of the phosphor is not particularly limited, but is preferably demineralized water or distilled water identical to the water in The washing medium, and having, in particular, an electrical conductivity that is ordinarily 0.01 μS/cm or higher, preferably 0.1 μS/cm or higher, and ordinarily 10 μS/cm or lower, preferably 1 μS/cm or lower. The temperature of the water used in the water dispersion test of the phosphor is ordinarily room temperature (about 25° C.).

As a result of washing such as the above there can be obtained the phosphor of the present invention such that a supernatant obtained after dispersion of the phosphor in 10 times its weight of water, and being left to stand thereafter for 1 hour, exhibits an electrical conductivity of 10 μS/cm or lower. The electrical conductivity of the supernatant in the water dispersion test of the phosphor can be measured using, for instance, a conductance meter "ES-12" by Horiba.

After the washing process, the phosphor is dried until no moisture remains adhered thereto. The phosphor is then ready for use. A distributing-sorting process may be further performed, as needed, in order to loosen aggregates.

[3. Use of the Phosphor]

The phosphor of the present invention can be used in any applications whore phosphors are utilized. The phosphor obtained in accordance with the present invention can be used singly in the form of the phosphor obtained in accordance with the present invention; however, the phosphor can be used in the form of phosphor mixtures of arbitrary combinations in which two or more phosphors obtained in accordance with the present invention are used concomitantly, or in which other phosphors are used concomitantly with phosphors obtained in accordance with the present invention.

The phosphor of the present invention can be used as a phosphor-containing composition by being mixed with a known liquid medium (for instance, a silicone-based compound).

The phosphor obtained in accordance with the present invention can be appropriately used, in particular, in various light-emitting devices, in combination with a light source that emits near-ultraviolet light to blue light, by exploiting a feature of the phosphor whereby the latter can be excited by near-ultraviolet light to blue light. The phosphor obtained in accordance with the present invention is ordinarily a green emitting phosphor, and hence a blue to green light-emitting device can be manufactured by combining the phosphor obtained in accordance with the present invention with an excitation light source that emits blue light. Since the phosphor obtained in accordance with the present invention emits green light, the phosphor can be used to manufacture a white light-emitting device by combining the phosphor obtained in accordance with the present invention with an excitation light source that omits blue light and with a phosphor that emits red light, or by combining the phosphor obtained in accordance with the present invention with an excitation light source that emits near-ultraviolet light and with a phosphor that emits blue light and with a phosphor that emits red light.

The emission color of the light-emitting device is not limited to white, and a light-emitting device that emits light of any color, for instance a light-bulb color (warm white) or pastel colors, can be produced by appropriately selecting combinations and contents of phosphors. The light emitting devices thus obtained can be used for illuminating devices or illuminant portions (especially, back-lightings of liquid crystal displays) of displays.

[4. Phosphor-Containing Composition]

The phosphor of the present invention can be used by being mixed with a liquid medium. In particular, the phosphor of the present invention is preferably used in the form of a dispersion in a liquid medium in those cases where the phosphor of the present invention is used in a light-emitting device or the like. A compound wherein the phosphor of the present invention is dispersed in a liquid medium will be referred to as "phosphor-containing composition of the present invention" as appropriate.

[4-1. Phosphor]

The type of the phosphor of the present invention that is incorporated in the phosphor-containing composition is not limited, and any type can be selected. The phosphor of the present invention that is incorporated in the phosphor-containing composition may be a single type alone; alternatively, two or more types can be used concomitantly in arbitrary combinations and ratios. The phosphor-containing composition may contain a phosphor other than the phosphor of the present invention, so long as the effect of the present invention is not significantly impaired thereby.

[4-2. Liquid Medium]

The type of liquid medium that is used in the phosphor-containing composition is not particularly limited, and there can be ordinarily used a curable material that can be molded so as to cover a semiconductor light-emitting element. Herein, a curable material denotes a fluid-like material that is cured as a result of some curing process. A fluid-like material denotes for instance a liquid or gel-like material. The concrete type of curable material is not particularly limited, so long as the material supports the role of guiding light emitted by a solid-state light-emitting element towards the phosphor. The curable material may be a single type alone; alternatively, two or more types can be used concomitantly in arbitrary combinations and ratios. Therefore, any from among an inorganic material, an organic material or a mixture thereof can be used as the curable material.

Examples of inorganic materials include, for instance, metal alkoxides, ceramic precursor polymers, and solutions obtained by hydrolytic polymerization, in accordance with a sol-gel method, of solutions that contain metal alkoxides; or inorganic materials (for instance, inorganic materials having siloxane bonds) that result from solidifying combinations of the foregoing.

Examples of organic materials include, for instance, thermosetting resins, photocurable resins and the like. Specific examples thereof include, for instance, (meth)acrylic resins such as polymethyl (meth)acrylate; styrenic resins such as polystyrene and styrene-acrylonitrile copolymers; polycarbonate resins; polyester resins; phenoxy resins; butyral resins; polyvinyl alcohol; cellulose resins such as ethyl cellulose, cellulose acetate and cellulose acetate butyrate; epoxy resins; phenolic resins; silicone rosins and the like.

Preferred among the foregoing curable materials are silicon-containing compounds, which have excellent alkali resistance, acid resistance and heat resistance, and which exhibit little deterioration on account of emission by the semiconductor light-emitting element. Silicon-containing compounds denote compounds having a silicon atom in the molecule, and include, for instance, organic materials (silicone-based compounds) such as polyorganosiloxanes, and inorganic materials such as silicon oxide, silicon nitride, silicon oxynitride and the like, and glass materials such as a borosilicate, phosphosilicate or alkali silicate. Preferred among the foregoing is a silicone-based material on account of the excellent transparency, adhesiveness, handleability and mechanical/thermal stress relieving characteristics of such materials.

A silicone-based material denotes ordinarily an organic polymer having a main chain of siloxane bonds. Herein there can be used, for instance, a silicone-based material of condensation type, addition type, improved sol-gel type or photocurable type.

As the condensation-type silicone-based material there can be used, for instance, a member for semiconductor light-emitting devices disclosed in, for instance, Japanese Patent Application publication Nos. 2007-112973 to 112975, 2007-19459 and 2008-34833. Condensation-type silicone-based materials have excellent adhesion to members such as packages, electrodes and light-emitting element that are used in semiconductor light-emitting devices. Therefore, these materials are advantageous in that they allow reducing to the minimum addition of components for enhancing adhesiveness, and in that the materials are excellent in heat resistance and light resistance, since crosslinking is mediated mainly by siloxane bonds.

As addition-type silicone-based materials there can be appropriately used, for instance, the silicone materials for potting disclosed in Japanese Patent Application Publication Nos. 2004-186168, 2004-221308 and 2005-327777, the organic modified silicone materials for potting disclosed in Japanese Patent Application Publication Nos. 2003-183881 and 2006-206919, the a silicone material for Injection molding disclosed in Japanese Patent Application Publication No. 2006-324596, and the silicone material for transfer molding disclosed in Japanese Patent Application Publication No. 2007-231173. Addition-type silicone materials are advantageous in that they boast a high degree of selection freedom as regards, for instance, curing rate and hardness of the cured product, and in that no components segregate during curing, cure shrinkage does not occur readily, and the materials are excellent also in deep curability.

As the improved sol-gel-type silicone-based material, which is one condensation-type silicone-based material, there can be appropriately used, for instance, the silicone materials disclosed in Japanese Patent Application Publication Nos. 2006-077234, 2006-291018 and 2007-119569. Improved sol-gel-type silicone materials are advantageous in that they boast a high degree of crosslinking, high heat resistance and light resistance, excellent durability, and afford a superior function of protecting phosphors having low gas permeability and low moisture resistance.

As photocurable-type silicone-based materials there can be appropriately used, for instance, the silicone materials disclosed in Japanese Patent Application Publication Nos. 2007-131812 and 2007-214543. Ultraviolet-curable silicone-based materials are advantageous in that they boast excellent productivity, as they are cured over a short time, and in that curing requires no high temperature, thanks to which deterioration of the light-emitting element is less likely to occur.

These silicone-based materials may be used singly, or, alternatively, a plurality of silicone-based materials may be used in mixtures, so long as curing is not inhibited by such mixing.

[4-3. Content Rate of Liquid Medium and Phosphor]

The content rate of the liquid medium may be any, so long as the effect of the present invention is not significantly impaired thereby, but is ordinarily 25 weight % or greater, preferably 40 weight % or greater, and ordinarily 99 weight % or smaller, preferably 95 weight % or smaller and more preferably 80 weight % or smaller; with respect to the entire phosphor-containing composition of the present invention. Even a large amount of liquid medium does not induce any problems particularly, but in order to achieve desired color coordinate, color rendering index, emission efficiency or the like when it is used for a semiconductor light emitting device, it is preferable that the liquid medium is used usually in the above-mentioned proportion. If the amount of liquid medium is excessively small, handling may be difficult on account of lowered fluidity.

The liquid medium serves mainly as binder, in the phosphor-containing composition of the present invention. The liquid medium may be used singly as one type; alternatively, two or more types can be used concomitantly in arbitrary combinations and ratios. In a case where, for instance, a silicon-containing compound is used for the purpose of improving heat resistance and light resistance, other thermosetting resins such as epoxy resins or the like may be incorporated to the extent that the durability of the silicon-containing compound is not impaired thereby. In such a case, it is preferable that the content of the other thermosetting resin is usually 25 weight % or lower, preferably 10 weight % or lower, to the whole amount of the liquid medium, which servos as the binder.

The content rate of the phosphor in the phosphor-containing composition may be any content rate, so long as the effect of the present invention is not significantly impaired thereby, but is ordinarily 1 weight % or greater, preferably 5 weight % or greater, more preferably 20 weight % or greater and ordinarily 75 weight % or smaller, preferably 60 weight % or smaller, with respect to the entire phosphor-containing composition of the present invention. The proportion of the phosphor of the present invention with respect to the phosphors in the phosphor-containing composition may be any proportion, but is ordinarily 30 weight % or greater, preferably 50 weight % or greater and ordinarily 100 weight % or smaller. The fluidity of the phosphor-containing composition is likelier to decrease, and handleability to worsen, if the phosphor content in the phosphor-containing composition is excessively large, while the emission efficiency of the light-emitting device tends to drop if the phosphor content is excessively small.

[4-4. Other Components]

So long as the effect of the present invention is not significantly impaired thereby, the phosphor-containing composition may contain, besides the phosphor and the liquid medium, also other components, for instance additives such as a metal oxide for refractive index adjustment, a spreading agent, a filler, a viscosity modifier, an UV absorbent or the like. These other components may be used as a single type alone; alternatively, two or more types can be used concomitantly in arbitrary combinations and ratios.

[b. Light-Emitting Device]

The light-emitting device of the present invention (hereinafter simply referred to as "light omitting device" as appropriate) is a light-emitting device comprising a first luminous body (excitation light source) and a second luminous body that can emit-visible light through conversion of light from the first luminous body to visible light. The light-emitting device includes, as the second luminous body, a first phosphor containing one or more types of the phosphor of the present invention as described in the section "1. Phosphor" above.

Preferred concrete examples of the phosphor of the present invention that is used in the light-emitting device of the present invention include, for instance, the phosphor of the present invention described in the section "1. Phosphor" above as well as the phosphors used in the various examples in the section "Examples" below. Any one type of the phosphor of the present invention may be used singly; alternatively, two or more types can be used concomitantly in arbitrary combinations and ratios.

The configuration of the light-emitting device of the present invention is not limited, and any configuration of known devices may be adopted, so long as the light-emitting device has the first luminous body (excitation light source) and uses at least the phosphor of the present invention as the second luminous body. Concrete examples of device configurations are described below.

In particular, a white light-emitting device, from among the light-emitting devices of the present invention is obtained, specifically, by relying on a known device configuration and by using an excitation light source such as the one described below, as the first luminous body, and by using any combination of the phosphor of the present invention and known phosphors, for instance a phosphor that emits blue fluorescence (hereafter, "blue phosphor" as appropriate"), a phosphor that emits green fluorescence (hereafter, "green phosphor" as appropriate), a phosphor that emits red fluorescence (hereafter, "red phosphor" as appropriate) and/or a phosphor that emits yellow fluorescence (hereafter, "yellow phosphor" as appropriate) as described below.

In this context, the white color of the white light emitting device includes all of (Yellowish) White, (Greenish) White, (Bluish) White, (Purplish) White and White, which are defined in JIS Z 8701. Of these, preferable is White.

[5-1. Configuration of the Light-Emitting Device]

<5-1-1. First Luminous Body>

The first luminous body of the light emitting device of the present invention emits light for exciting the second luminous body to be described later.

The emission peak wavelength of the first luminous body is not particularly limited, so long as it overlaps with the absorption wavelength of the second luminous body described below. Thus, there can be used a luminous body having a wide emission wavelength region. Ordinarily, there is used a luminous body having an emission wavelength from the ultraviolet region to the blue region.

It is preferable that the luminous peak wavelength of the first luminous body usually has a concrete value of 200 nm or longer. In a case where blue light is used as the excitation light, there is preferably utilized a luminous body having an emission peak wavelength that is ordinarily 420 nm or longer, preferably 430 nm or longer, more preferably 440 nm or longer and ordinarily 480 nm or shorter, preferably 470 nm or shorter, and more preferably 460 nm or shorter. In a case where near-ultraviolet light is used as the excitation light, there is preferably utilized a luminous body having an emission peak wavelength that is ordinarily 300 nm or longer, preferably 330 nm or longer, more preferably 360 nm or longer and ordinarily 420 nm or shorter, preferably 410 nm or shorter, and more preferably 400 nm or shorter.

Ordinarily, a semiconductor light-emitting element, specifically, a light-emitting diode (LED), a laser diode (LD) or the like, is used as the first luminous body. Other examples of the luminous body that can be used as the first luminous body include an organic electroluminescence luminous element, inorganic electroluminescence luminous element or the like.

However, the luminous body that can be used as the first luminous body is not restricted to those exemplified in the present Description.

Among them, a GaN-based LED and GaN-based LD, using a GaN-based compound semiconductor, are preferable for the first luminous body. This is because the emission output and external quantum efficiency of a GaN-based LED and a GaN-based LD are far greater than those of a SiC-based LED and the like that emit the light in the same region. Thus, very bright emission at low power can be achieved by combining a GaN-based LED and a GaN-based LD with the above-described phosphor. For example, when applying current load of 20 mA, a GaN-based LED and GaN-based LD usually have emission intensity 100 times or higher than that of an SiC-based ones. A preferred GaN-based LED or LD has an $Al_XGa_YN$ luminous layer, a GaN luminous layer or an $In_XGa_YN$ luminous layer. Among the foregoing, a GaN-based LED having an $In_XGa_YN$ luminous layer is particularly preferred, on account of the very high emission intensity afforded in that case; yet more preferably, the GaN-based LED has a multiple quantum well structure of $In_XGa_YN$ layers and GaN layers.

In the above description, the X+Y usually takes a value in the range of 0.8 or greater to 1.2 or smaller.

A GaN-based LED having a such kind of luminous layer that is doped with Zn or Si or without any dopant is preferable for the purpose of adjusting the luminescent characteristics.

A GaN-based LED contains, as its basic components, a such kind of luminous layer, p layer, n layer, electrode and substrate. Among them, a GaN-based LED having such a heterostructure as sandwiching the luminous layer with n type and p type of AlxGayN layers, GaN layers, InxGayN layers or the likes is preferable, from the standpoint of high emission efficiency. Moreover, the one whose heterostructure is replaced by a quantum well structure is more preferable because it can show higher emission efficiency.

The first luminous body can be used either as a single one or as a mixture of two or more of them in any combination and in any ratio.

<5-1-2. Second Luminous Body>

The second luminous body of the light-emitting device of the present invention is a luminous body that emits visible light when irradiated with light from the above-described first luminous body; the second luminous body contains one or more types of the phosphor of the present invention, as a first phosphor and contains appropriately, depending, for instance, on the intended use, also a second phosphor (blue phosphor, green phosphor, yellow phosphor, orange phosphor, red phosphor or the like). The second luminous body is formed, for example, so that the first and the second phosphors are dispersed in a sealing material.

The composition of the phosphor (second phosphor), other than the phosphor of the present invention, that is used in the second luminous body, is not particularly limited, and may be, for instance, a combination of an activating element or co-activating element in the form of ions of a rare earth metal such as Ce, Pr, Nd, Pm, Sm, Eu, Tb, Dy, Ho, Er, Tm or Yb, or ions of a metal such as Ag, Cu, Au, Al, Mn or Sb, in a host crystal of a metal oxide typified by $Y_2O_3$, $YVO_4$, $Zn_2SiO_4$, $Y_3Al_5O_{12}$, $Sr_2SiO_4$ or the like, a metal nitride, typified by $Sr_2Si_5N_8$ or the like, a phosphate, typified by $Ca_5(PO_4)_3Cl$ or the like, a sulfide, typified by ZnS, SrS, CaS or the like, or an oxysulfide, typified by $Y_2O_2S$, $La_2O_2S$ or the like.

Table 1 sets forth concrete examples of preferred crystal hosts.

TABLE 1

| Type | Specific examples |
| --- | --- |
| Sulfides | (Zn, Cd)S, (Ca, Sr, Ba)S, (Ca, Sr, Ba)$Ga_2S_4$ |
| Aluminates | (Y, Gd, Lu)$_3$(Al, Ga, Sc)$_5O_{12}$, $YAlO_3$, |
|  | (Ba, Sr, Ca)(Mg, Zn, Mn)$Al_{10}O_{17}$, |
|  | (Ca, Sr, Ba)$Al_{12}O_{19}$, (La, Ce)$MgAl_{11}O_{19}$, |
|  | (Mg, Ca, Sr, Ba)$Al_2O_4$, $BaAl_2Si_2O_8$, $Sr_4Al_{14}O_{25}$ |
| Silicates | (Ca, Sr, Ba, Mg)$_2SiO_4$, (La, Gd, Y, Lu)$_2SiO_6$, $Zn_2SiO_4$ |
| Oxides | $SnO_2$, (Y, Gd, Lu)$_2O_3$ |
| Borates | $GdMgB_5O_{10}$, (Y, Gd)$BO_3$ |
| Halophospates | (Sr, Ca, Ba, Mg)$_{10}(PO_4)_6$(F, Cl)$_2$ |
| Phosphates | $Sr_2P_2O_7$, (La, Ce, Gd, Y)$PO_4$ |
| Nitirides | (Mg, Ca, Sr, Ba)$_2Si_5N_8$, (Ca, Sr)$AlSiN_3$ |
| Oxynitrides | (Ca, Sr, Ba)$Si_2N_2O_2$, (Ba, Sr)$_3Si_6O_{12}N_2$ |
| Vanadates | (La, Gd, Y, Lu)$VO_4$ |
| Thngstates | $CaWO_4$ |

The element compositions of the host crystal and activating element or co-activating element are not particularly limited, and the elements may be partially replaced by elements of the same group. Any obtained phosphor can be used so long as it absorbs light in the near-ultraviolet to visible region and emits visible light.

More concretely, those listed below can be used as phosphor. However, the lists are just examples and phosphors that can be used in the present invention are not limited to those examples.

In the following examples, phosphors with different partial structure are shown abbreviated as a group for the sake of convenience, as mentioned earlier.

<5-1-2-1. First Phosphor>

The second luminous body in the light-emitting device of the present invention contains the first phosphor that comprises at least the above-described phosphor of the present invention. Any one type of the phosphor of the present invention may be used singly; alternatively, two or more types can be used concomitantly in arbitrary combinations and ratios. The color of the phosphor of the present invention may be appropriately adjusted so as to achieve a desired emission color.

<5-1-2-2. Second Phosphor>

The second luminous body of the light emitting device of the present invention may contain another phosphor (namely, a second phosphor) in addition to the above-mentioned first phosphor, depending on its use. Such a second phosphor is usually used for adjusting color tone of light emission of the second luminous body. Therefore, as the second phosphor, a phosphor emitting a different-color fluorescence from the first phosphor is often used. In a case where, for instance, a green phosphor is used as the first phosphor, then a phosphor other than a green phosphor, for instance a blue phosphor, a red phosphor, a yellow phosphor or the like may be used as the second phosphor. However, a phosphor of the same color as that of the first phosphor can also be used as the second phosphor.

The weight-average median diameter D50 of the second phosphor used in the light-emitting device of the present invention is ordinarily 2 μm or greater, preferably 5 μm or greater, and ordinarily 30 μm or smaller, preferably 20 μm or smaller. If the weight-average median diameter D50 is too small, luminance tends to drop, and phosphor particles tend to aggregate. On the other hand, the weight-average median diameter is too large, unevenness in coating, clogging in a dispenser or the like tend to occur.

(Blue Phosphor)

In a case where a blue phosphor is used in addition to the phosphor of the present invention, any blue phosphor may be used, so long as the effect of the present invention is not significantly impaired thereby. In that case, the emission peak wavelength of the blue phosphor is ordinarily 420 nm or longer, preferably 430 nm or longer, more preferably 440 nm or longer and ordinarily 490 nm or shorter, preferably 480 mm or shorter, more preferably 470 nm or shorter, and yet more preferably 460 nm or shorter. That is because if the emission peak wavelength of the blue phosphor that is used lies within the above ranges, the excitation band thereof overlaps with that of the phosphor of the present invention, and the phosphor of the present invention can be excited with good efficiency by the blue light from such a blue phosphor. Table 2 sets forth phosphors that can be used as such a blue phosphor.

TABLE 2

Blue phosphors

| Type | Specific examples of phosphors that can be used |
|---|---|
| Eu-activated aluminate phosphor | (Ba, Sr, Ca)MgAl$_{10}$O$_{17}$: Eu, (Sr, Ca, Ba)Al$_2$O$_4$: Eu, BaAl$_8$O$_{13}$: Eu, (Sr, Ca, Ba)$_4$Al$_{14}$O$_{25}$: Eu |
| Eu-activated silicate phosphor | BaAl$_2$Si$_2$O$_8$: Eu, (Sr, Ba)$_2$MgSi$_2$O$_3$: Eu, (Ba, Ca, Mg, Sr)$_2$SiO$_4$: Eu |
| Eu-activated phosphate phosphor | (Ca, Sr, Ba)$_2$P$_2$O$_7$: Eu |
| Eu-activated borosilicate phosphor | (Ba, Sr, Ca)BPO$_7$: Eu, 2SrO•0.84P$_2$O$_5$•0.16B$_2$O$_3$: Eu |
| Eu activated halophosphate phosphor | (Mg, Ca, Sr, Ba)$_6$(PO$_4$)$_3$(Cl, F): Eu, (Ba, Sr, Ca)$_6$(PO$_4$)$_3$(Cl, F, Br, OH): Eu, Mn, Sb |
| Eu-activated haloborate phosphor | (Ca, Sr, Ba)$_2$B$_3$O$_9$Cl: Eu |
| Eu-activated halosilicate phosphor | Sr$_2$Si$_2$O$_8$•2SrCl$_2$: Eu |
| Eu-activated oxynitride phosphor | SrSi$_9$Al$_{18}$ON$_{31}$: Eu, EuSi$_9$Al$_{19}$ON$_{31}$ |
| Eu, Mn-activated aluminate phosphor | (Ba, Sr, Ca)MgAl$_{10}$O$_{17}$: Eu, Mn |
| Eu, Mn-activated borophosphate phosphor | (Ba, Sr, Ca)BPO$_5$: Eu, Mn, (Sr, Ca)$_{10}$(PO$_4$)$_6$•nB$_2$O$_3$: Eu, 2SrO•0.84P$_2$O$_5$•0.16B$_2$O$_3$: Eu |
| Ce activated silicate phosphor | Y$_2$SiO$_5$: Ce |
| Ce-activated oxynitride phosphor | LaAl(Si, Al)$_6$(N, O)$_{10}$: Ce, (La, Ca)Al(Si, Al)$_6$(N, O)$_{10}$: Ce |

TABLE 2-continued

Blue phosphors

| Type | Specific examples of phosphors that can be used |
|---|---|
| Ce-activated nitride phosphor | LaSi$_3$N$_6$: Ce |
| Ce-activated thiogallate phosphor | (Ca, Sr, Ba)Ga$_2$S$_4$: Ce |
| Sulfide phosphor | ZnS: Ag, ZnS: Ag, Al |
| Tungstate phosphor | CaWO$_4$, CaWO$_4$: Pb |
| Sn-activated phosphor | Sr$_2$P$_2$O$_7$: Sn |
| Fluorescent dye | Naphthalimide compounds, Benzoxazole compounds, Styryl compounds, Coumarine compounds, Pyrazoline compounds, Triazole compounds |
| Organic phosphor | Thulium complex |

Preferred blue phosphors among the foregoing are (Ca,Sr,Ba)MgAl$_{10}$O$_{17}$:Eu, (Sr,Ca,Ba,Mg)$_{10}$(PO$_4$)$_6$(Cl,F)$_2$:Eu, (Ba,Ca,Mg,Sr)$_2$SiO$_4$:Eu and (Ba,Ca,Sr)$_3$MgSi$_2$O$_8$:Eu, more preferably (Ba,Sr)MgAl$_{10}$O$_{17}$:Eu, (Ca,Sr,Ba)$_{10}$(PO$_4$)$_6$(Cl,F)$_2$:Eu and Ba$_3$MgSi$_2$O$_8$:Eu, and particularly preferably Sr$_{10}$(PO$_4$)$_6$Cl$_2$:Eu and BaMgAl$_{10}$O$_{17}$:Eu.

(Green Phosphor)

In a case where a green phosphor is used in addition to the phosphor of the present invention, any green phosphor may be used, so long as the effect of the present invention is not significantly impaired thereby. The emission peak wavelength of the green phosphor is ordinarily longer than 500 nm, preferably 510 nm or longer, and more preferably 515 nm or longer, and ordinarily 550 nm or shorter, preferably 542 nm or shorter and more preferably 535 nm or shorter. If the emission peak wavelength is too short, light tends to become bluish, whereas if the emission peak wavelength is too long, light tends to become yellowish. The green emission characteristic is impaired in both cases. Table 3 sets forth phosphors that can be used as such a green phosphor.

TABLE 3

Green phosphors

| Type | Specific examples of phosphors that can be used |
|---|---|
| Eu-activated alkaline earth silicon oxynitride-based oxynitride phosphor | (Mg, Ca, Sr, Ba)Si$_2$O$_2$N$_2$: Eu, (Ba, Sr, Ca)$_3$Si$_6$O$_{12}$N$_2$ : Eu, (Ba, Sr, Ca)$_3$Si$_6$O$_9$N$_4$: Eu, (Si, Al)$_6$(O, N)$_8$: Eu(β-SiAlON), BaSi$_7$N$_{10}$: Eu, (Ba, Sr)(Si, Al)$_7$(N, O)$_{10}$: Eu |
| Eu-activated aluminate phosphor | Sr$_4$Al$_{14}$O$_{25}$: Eu, SrAl$_2$O$_4$: Eu, (Ba, Sr, Ca)Al$_2$O$_4$: Eu |
| Eu-activated silicate phosphor | (Ba, Sr, Ca, Mg)$_2$SiO$_4$: Eu (Sr, Ba)Al$_2$Si$_2$O$_8$: Eu, Ba$_9$Sc$_2$Si$_6$O$_{24}$: Eu, (Ba, Sr, Ca)$_2$(Mg, Zn)Si$_2$O$_7$: Eu, (Ba, Ca, Sr, Mg)$_9$(Sc, Y, Lu, Gd)$_2$(Si, Ge)$_6$O$_{24}$: Eu |
| Eu-activated borophosphate phosphor | Sr$_2$P$_2$O$_7$•Sr$_2$B$_2$O$_6$: Eu |
| Eu-activated halosilicate phosphor | Sr$_2$Si$_3$O$_3$•2SrCl$_2$: Eu Ca$_3$SiO$_4$Cl$_2$: Eu |
| Eu-activated thiogallate phosphor | (Sr, Ba, Ca)Ga$_2$S$_4$: Eu |
| Eu-activated thioaluminate phosphor | (Sr, Ca, Ba)(Al, Ga, In)$_2$S$_4$: Eu |
| Eu, Mn-activated aluminate phosphor | (Ba, Sr, Ca)MgAl$_{10}$O$_{17}$: Eu, Mn |
| Eu, Mn-activated halosilicate phosphor | (Ca, Sr)$_8$(Mg, Zn)(SiO$_4$)$_4$Cl$_2$: Eu, Mn |

TABLE 3-continued

| Green phosphors | |
|---|---|
| Type | Specific examples of phosphors that can be used |
| Co-activated aluminate phosphor | $(Y, Gd, Tb, La, Sm, Pr, Lu)_3(Al, Ga, Sc)_5O_{12}$: Ce |
| Ce-activated silicate phosphor | $(Ca, Sr, Na, Li)_2(Sc, Mg, Na, Li)_2(Si, Ge)_3O_{12}$: Ce |
| Ce-activated oxide phosphor | $(Ca, Sc)Sc_2O_4$: Ce |
| Tb-activated aluminate phosphor | $CaMgAl_{11}O_{19}$: Tb, $Y_3Al_6O_{12}$: Tb, |
| Tb-activated silicate phosphor | $Ca_7Y_8(SiO_4)_6O_2$: Tb, $La_3Ga_6SiO_{14}$: Tb |
| Tb-activated oxysulfide phosphor | $(La, Gd, Y)_2O_2S$: Tb |
| Ce, Tb-activated phosphor | $Y_2SiO_5$: Ce, Tb |
| Ce, Tb-activated phosphate phosphor | $LaPO_4$: Ce, Tb |
| Ce, Tb-activated borate phosphor | $(Y, Ga, Lu, Sc, La)BO_3$: Ce, Tb $Na_2Gd_2B_2O_7$: Ce, Tb $(Ba, Sr)_2(Ca, Mg, Zn)B_2O_6$: K, Ce, Tb |
| Mn-activated phosphor | $Zn_2(Si, Ga)O_4$: Mn, $Zn(Al, Ga)_2O_4$: Mn |
| Sulfide phosphor | ZnS: Cu, Al, ZnS: Cu, Au, Al |
| Fluorescent dye | Pyridine-phthalimide condensed derivatives, Benzoxadinone compounds, Quinazolinone compounds, Coumarine compounds, Quinophthalone compounds, Naphthalimide compounds |
| Organic phosphor | Terbium complex |
| Eu-activated oxynitride phosphor | $Sr_3Si_{13}Al_3O_2N_{21}$: Eu |

Preferred green phosphors among the foregoing are $Y_3(Al, Ca)_5O_{12}$:Tb, $CaSc_2O_4$:Ce, $Ca_3(Sc,Mq)_2Si_3O_{12}$:Ce, $(Sr,Ba)_2SiO_4$:Eu, $(Si,Al)_6(O,N)_8$:Eu (β-sialon), $(Ba,Sr)_3Si_6O_{12}$:N$_2$: Eu, $SrGa_2S_4$:Eu and $BaMgAl_{10}O_{17}$:Eu,Mn.

In a case where the obtained light-emitting device is used in an illuminating device, preferred examples are $Y_3(Al,Ga)_5O_{12}$:Tb, $CaSc_2O_4$:Ce, $Ca_3(Sc,Mg)_2Si_3O_{12}$:Ce, $(Sr,Ba)_2SiO_4$:Eu, $(Si,Al)_6(O,N)_8$:Eu(β-sialon) and $(Ba,Sr)_3Si_6O_{12}N_2$:Eu.

If the obtained light-emitting device is used in an image display device, preferred examples are $(Sr,Ba)_2SiO_4$:Eu, $(Si,Al)_6(O,N)_8$:Eu(β-sialon), $(Ba,Sr)_3Si_6O_{12}Na_2$:Eu, $SrGa_2S_4$:Eu and $BaMgAl_{10}O_{17}$:Eu,Mn.

(Yellow Phosphor)

In a case where a yellow phosphor is used in addition to the phosphor of the present invention, any yellow phosphor may be used, so long as the effect of the present invention is not significantly impaired thereby. In that case, the emission peak wavelength of the yellow phosphor is ordinarily 530 nm or longer, preferably 540 nm or longer, more preferably 550 nm or longer and ordinarily 620 nm or shorter, preferably 600 nm or shorter, and more preferably 580 nm or shorter. Table 4 sets forth phosphors that can be used as such a yellow phosphor.

TABLE 4

| Yellow phosphors | |
|---|---|
| Type | Specific examples of phosphors that can be used |
| Garnet phosphor | $(Y, Gd, Tb, Lu, Sm)_3(Al, Ga, Sc)_5O_{12}$: Ce, $(Ca, Sr, Na, Li)_3(Sc, Mg)_2(Si, Ge)_3O_{12}$: Ce, $Lu_2CaMg_2(Si, Ge)_3O_{12}$: Ce |
| Orthosilicate phosphor | $(Ba, Sr, Ca, Mg, Zn)_2(Si, Ge)O_4$: Eu |
| Ce-activated nitride phosphor | $(Ca, Sr, Ba)AlSiN_3$: Ce, $Y_2Si_4N_6C$: Ce, $(La, Ca)_3Si_6N_{11}$: Ce |
| Ce-activated oxynitride phosphor | $(Ca, Sr, Ba, Mg, Zn)AlSi(N, O)_3$: Ce, |
| Sulfide phosphor | $(Ca, Sr)(Ga, Al)_2S_4$: Eu |
| Eu-activated oxynitride phosphor | $Ca_x(Si, Al)_{12}(O, N)_{16}$: Eu (α-sialon) |
| Fluorescent dye | brilliant sulfoflavine FF (Colour Index Number 56205), basic yellow HG (Colour Index Number 46040), eosine (Colour Index Number 45380), rhodamine 6G (Colour Index Number 45160) |
| Eu-activated halosilicate phosphor | $SiO_2 \cdot 1.0(Ca, Sr)O \cdot 0.17SrCl_2$ |

Preferred yellow phosphors among the foregoing are $Y_3Al_5O_{12}$:Ce, $(Y,Gd)_3Al_5O_{12}$:Ce, $(Sr,Cu,Ba,Mg)_2SiO_4$:Eu and $(Ca,Sr)Si_2N_2O_2$:Eu.

(Orange to Red Phosphor)

In a case where an orange to red phosphor is used in addition to the phosphor of the present invention, any orange to red phosphor may be used, so long as the effect of the present invention is not significantly impaired thereby. In that case, the emission peak wavelength of the orange to red phosphor is ordinarily 570 nm or longer, preferably 580 nm or longer and more preferably 585 nm or longer, and ordinarily 780 nm or shorter, preferably 700 nm or shorter, and more preferably 680 nm or shorter. Table 5 sets forth phosphors that can be used as such an orange to red phosphor.

TABLE 5

| Orange to red phosphors | |
|---|---|
| Type | Specific examples of phosphors that can be used |
| Eu-activated oxysulfide phosphor | $(La, Gd, Y, Lu)_2O_2S$: Eu |
| Eu-activated oxide phosphor | $Y(V, P)O_4$: Eu, $(La, Gd, Y)_2O_3$: Eu |
| Eu-activated aluminate phosphor | $YAlO_3$: Eu |
| Eu-activated tungstate phosphor | $LiW_2O_3$: Eu, $LiW_2O_8$: Eu, Sm, $Eu_2W_2O_9$, $Eu_2W_2O_9$: Nb, $Eu_2W_2O_9$: Sm, $(Y, Lu)_2WO_6$: Eu, Mo |
| Eu-activated sulfide phosphor | $(Ca, Sr, Ba, Mg)S$: Eu, $(Ca, Sr, Ba)Y_2S_4$: Eu |
| Eu-activated silicato phosphor | $Ca_2Y_8(SiO_4)_6O_2$: Eu, $LiY_9(SiO_4)_6O_2$: Eu, $(Sr, Ba, Ca)_3SiO_6$: Eu |
| Eu-activated borate phosphor | $(Ba, Sr)_2Mg(BO_3)_2$: Eu, $Ba_2LiB_5O_{10}$: Eu |

TABLE 5-continued

Orange to red phosphors

| Type | Specific examples of phosphors that can be used |
| --- | --- |
| Eu-activated nitride phosphor | (Mg, Ca, Sr, Ba)AlSiN$_3$: Eu, <br> (Mg, Ca, Sr, Ba)$_2$(Si, Al)$_6$N$_3$: Eu, <br> (Mg, Ca, Sr, Ba)SiN$_2$: Eu <br> SrAlSi$_4$N$_7$: Eu |
| Eu-activated oxynitride phosphor | (Mg, Ca, Sr, Ba)$_2$Si$_3$(N, O)$_8$: Eu, <br> (Mg, Ca, Sr, Ba)Si(N, O)$_2$: Eu, <br> (Mg, Ca, Sr, Ba)AlSi(N, O)$_3$: Eu, <br> (Ca, Y, Li)$_x$(Si, Al)$_{12}$(O, N)$_{16}$: Eu(α-SiAlON), <br> SrAl$_2$SiN$_2$O$_3$: Eu, SrAlSi$_2$N$_3$O$_2$: Eu <br> Sr2(Al, Si)10(N, O)13: Eu |
| Eu, Mn-activated halophosphate phosphor | (Ca, Sr, Ba, Mg)$_{10}$(PO$_4$)$_6$(F, Cl, Br, OH): Eu, Mn |
| Eu, Mn-activated silicate phosphor | (Ba, Sr, Ca, Mg)$_2$SiO$_4$: Eu, Mn, <br> (Ba, Sr, Ca, Mg)$_3$(Zn, Mg)Si$_2$O$_8$: Eu, Mn |
| Eu, Mn-activated phosphate phosphor | (Sr, Ca, Ba, Mg, Zn)$_2$P$_2$O$_7$: Eu, Mn |
| Eu, Bi-activated phosphor | (Gd, Y, Lu, La)$_2$O$_3$: Eu, Bi, <br> (Gd, Y, Lu, La)$_2$O$_2$S: Eu, Bi, <br> (Gd, Y, Lu, La)VO$_4$: Eu, Bi |
| Eu, Ce-activated sulfide phosphor | (Ca, Sr, Ba)Y$_2$S$_4$: Eu, Ce |
| Eu, Ce-activated nitride phosphor | (Ba, Sr, Ca)$_x$Si$_y$N$_z$: Eu, Ce (wherein x, y and z are integers equal to or greater than 1, for instance, (x, y, z) = (2, 5, 8), (1, 1, 2), (1, 7, 10)). |
| Ce-activated silicate phosphor | ((Y, Lu, Gd, Tb)$_{1-x-y}$Sc$_x$Ce$_y$)$_2$(Ca, Mg)$_{1-r}$(Mg, Zn)$_{2+r}$Si$_{x-q}$Ge$_q$O$_{12+d}$) (wherein x, y, z, r, q and d satisfy 0 ≤ x ≤ 1, 0 < y ≤ 0.3, 2.5 ≤ z ≤ 3.5, 0 ≤ r < 1, 0 ≤ q ≤ 3, −1.5 < d ≤ 1.5). |
| Ce-activated aluminate phosphor | (Y, Gd, Tb, Lu)$_2$Al$_5$O$_{12}$: Ce |
| Mn-activated germanate phosphor | 3.5MgO•0.5MgF$_2$•GeO$_2$: Mn |
| Mn-activated fluoride phosphor | (Li, Na, K, Rb, Ce)$_2$(Ti, Zr, Si, Ge)F$_4$: Mn, <br> (Li, Na, K, Rb, Ce)$_3$(Al, Ge)F$_6$: Mn |
| Other Mn-activated phosphor | Me$_2$TiO$_4$: Mn, MgGa$_2$O$_4$: Mn |
| Red organic phosphor | Rare-earth element ion complex containing an anion ligand such as a b-diketonate, a b-diketone, an aromatic carboxylic acid, a bronated acid or the like |
| Pigment | Perylene pigments (for example, dibenzo|[f,f']4,4',7.7'-tetraphenyl|diindeno[1,2,3-cd: 1',2',3'-lm]perylene), anthraquinone pigments, lake pigments, azo pigments, quinacridone pigments, anthracene pigments, isoindoline pigments, iso-indolinone pigments, phthalocyanine pigments, triphenylmethane basic dyes, indanthrone pigments, indophenol pigments, cyanine pigments, dioxazine pigments |

Preferred examples of a rod phosphor among the foregoing are (Ca,Sr,Ba)$_2$Si$_5$(N,O)$_8$:Eu, (Ca, Sr,Ba)Si(N,O)$_2$:Eu, (Ca, Sr,Ba)AlSi(N,O)$_3$:Eu, (Sr,Ba)$_3$SiO$_5$:Eu, (Ca,Sr)S:Eu, (La, Y)$_2$O$_2$S:Eu, a β-diketone Eu complex such as a Eu(dibenzoylmethanoc)$_3$.1,10-phenanthroline complex, a carboxylic acid Eu complex and K$_2$SiF$_6$:Mn, and more preferably (Ca, Sr,Ba)$_2$Si$_5$(N,O)$_8$:Eu, (Sr,Ca)AlSi(N,O)$_3$:Eu, (La,Y)$_2$O$_2$S: Eu and K$_2$SiF$_6$:Mn.

Preferred orange phosphors are (Sr,Ba)$_3$SiO$_5$:Eu, (Sr, Ba)$_2$SiO$_4$:Eu, (Ca,Sr,Ba)$_2$Si$_5$(N,O)$_8$:Eu and (Ca,Sr,Ba)AlSi (N,O)$_3$:Ce.

[6. Embodiment of the Light-Emitting Device]
[4-1. Embodiment of the Light-Emitting Device]

The light emitting device of the present invention will be explained in detail below with reference to a concrete embodiment. However, it is to be noted that the present invention is by no means restricted to the following embodiment and that the latter may accommodate all manner of modifications without departing from the scope of the present invention.

FIG. 1 is a schematic perspective view illustrating the positional relationship between the first luminous body, which functions as the excitation light source, and the second luminous body, constructed as the phosphor-containing part containing a phosphor, in an example of the light emitting device of the present invention. In FIG. 1, the numeral. 1 indicates a phosphor-containing part (second luminous body), the numeral 2 indicates a surface emitting type GaN-based LD as an excitation light source (first luminous body), and the numeral 3 indicates a substrate. In order to bring about a mutually connected state, the LD 2 and the phosphor-containing part 1 (second luminous body) may be prepared separately, and the respective surfaces may be brought into contact with each other by way of an adhesive or by some other means. Alternatively, a film of the phosphor-containing part 1 (second luminous body) may be formed (molded) on the emission surface of the LD 2. As a result, the LD 2 and the phosphor-containing part 1 (second luminous body) can be brought to a state of being in contact with each other.

With such device configurations, light quantity loss, induced by a leakage of light emitted from the excitation light source (first luminous body) and reflected on the layer surface of the phosphor-containing part (second luminous body) to outside, can be avoided, which makes possible enhancement in emission efficiency of the entire device.

Figure 2A:
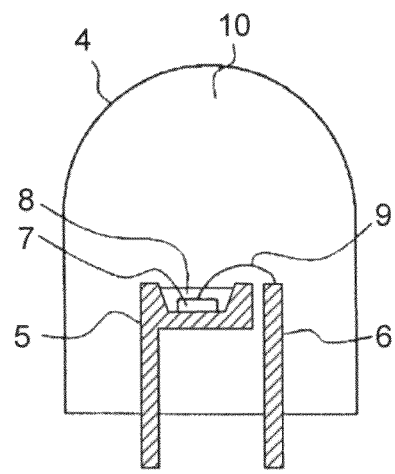
FIG. 2A is a schematic cross-sectional diagram illustrating an embodiment of a bullet-type light-emitting device.

FIG. 2A is a typical example of a light-emitting device of a form ordinarily referred to as of bullet type. The figure is a schematic cross-sectional diagram illustrating an embodiment of a light-emitting device having an excitation light source (first luminous body) and a phosphor-containing part (second luminous body). In the light-emitting device 4, the numeral 5 indicates a mount lead, the numeral 6 indicates an Inner lead, the numeral 7 indicates an excitation light source (first luminous body), the numeral 8 indicates a phosphor-containing part, the numeral 9 indicates a conductive wire and the numeral 10 indicates a mold member.

Figure 2B:
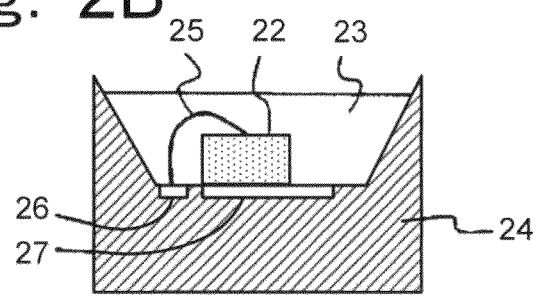
FIG. 2B is a schematic cross-sectional diagram illustrating an embodiment of a surface-mount type light-emitting device.

FIG. 2B is a typical example of a light-emitting device of a form ordinarily referred to as of surface-mount type. The figure is a schematic cross-sectional diagram illustrating an embodiment of a light-emitting device having an excitation light source (first luminous body) and a phosphor-containing part (second luminous body). In the figure, the numeral 22 indicates an excitation light source (first luminous body), the numeral 23 indicates a phosphor-containing part (second luminous body), the numeral 24 indicates a frame, the numeral 25 indicates a conductive wire, and the numeral 26 and the numeral 27 indicate electrodes.

[6-2. Use of the Light-Emitting Device]

The applications of the light-emitting device of the present invention are not particularly limited, and the device can be used in various fields where ordinary light-emitting devices are utilized. On account of the high color rendering and the wide color reproduction range that the light-emitting device of the present invention affords, the latter is particularly suitably used as a light source in illuminating devices and image display devices.

<6-2-1. Illuminating Device>

The application of the light emitting device of the present invention to an illuminating device can be carried out by incorporating a light emitting device such as described earlier into a known illuminating device as appropriate. A surface-emitting illuminating device (11), shown in FIG. 3, in which the aforementioned light emitting device (4) is incorporated, can be cited as the example.

Figure 3:
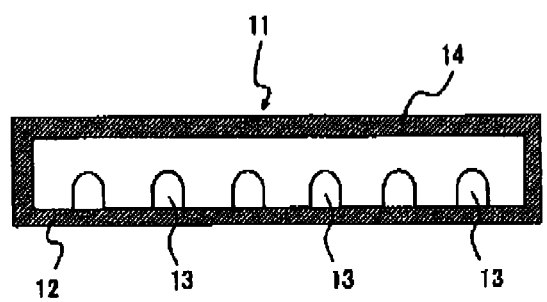
FIG. 3 is a schematic cross-sectional diagram illustrating an embodiment of an illuminating device provided with a light-emitting device of the present invention.

FIG. 3 is a sectional view schematically illustrating an embodiment of the illuminating device of the present invention. As shown in this FIG. 3, the surface-emitting illuminating device comprises a large number of light emitting devices (13) (corresponding to the aforementioned light emitting device (4)) on the bottom surface of a rectangular holding case (12), of which inner surfaces are made to be opaque ones such as white smooth surfaces, and a power supply, circuit or the like (not shown in the figure) for driving the light emitting devices (13) outside the holding case. In addition, it comprises a milky-white diffusion plate (14), such as an acrylic plate, at the place corresponding to the cover part of the holding case (12), for homogenizing the light emitted.

When the surface-emitting illuminating device (11) is driven by means of applying a voltage to the excitation light source (the first luminous body) of the light emitting device (13), light is emitted from the light source and the aforementioned phosphor in the phosphor-containing resinous part, which serves as phosphor-containing part (the second luminous body), absorbs a part of the emitted light and emits visible light. On the other hand, the blue light that is not absorbed in the phosphor is mixed with the visible light to form a light emission with high color rendering, and then the mixed light passes through the diffusion plate (14) to be radiated in the upward direction of the figure. Consequently, an illumination light with a brightness that is uniform within the surface of the diffusion plate (14) of the holding case (12) can be obtained.

<6-2-2. Image Display Device>

When the light emitting device of the present invention is used as a light source in a display, there is no limitation on the concrete configuration of the display. However, it is preferable to be used together with a color filter. For example, a color display, which is a kind of display, utilizing a color liquid-crystal display element can be formed by combining the above-mentioned light emitting device as back-lighting, an optical shutter utilizing a liquid crystal, and a color filter having red, green and blue picture elements.

EXAMPLES

The present invention will be explained in more detail on the basis of examples. Within the scope of the invention, however, the latter is not limited by the examples in any way.

Example 1

As starting materials there were weighed 95.25 weight % of $Si_3N_4$ (SN-E10 grade, by Ube Industries), 1.06 weight % of $Eu_2O_3$ (RU grade, by Shin-Etsu Chemical), 3.29 weight % of AlN (F grade, by Tokuyama), and 0.40 weight % of $Al_2O_3$ (TM-DAR grade, by Taimei Chemicals).

The above-described starting materials were caused to pass, in their entirety, through a 100 μm-mesh nylon sieve, and were dry-mixed for 60 minutes using a rocking mixer ("RM-10", by Aichi Electric). The whole was then vibration-mixed using a vibrating mill (MB-1, by Chuo Kakohki) for 60 minutes, and was further caused to pass in its entirety through a 100 μm-mesh nylon sieve.

The obtained phosphor starting material mixture was filled into a 200 g crucible made up of boron nitride, having an outer diameter of 9 cm and a height of 10 cm, and was fired by being held at 2000° C. for 12 hours in a pressure nitriding furnace FVPS-R-160/150 by Fuji Electronic Ind., in an atmosphere at 0.92 MPa of nitrogen pressure. The obtained fired powder was caused to pass through a nylon mesh (N-No. 305T, 48 μm mesh).

Thereafter, the obtained powder was charged in a boron nitride crucible having an outer diameter of 6 cm and a height of 3.5 cm. The crucible was placed in a pipe-like furnace and was subjected to a thermal treatment by being heated for 8 hours at 1450° C. under a stream of 0.5 L/minute of argon gas.

The powder obtained as a result of the thermal treatment was caused to pass in its entirety through a nylon mesh (N-No. 305T, 40 μm mesh).

The obtained phosphor powder, in an amount of 1 g, was added to an aqueous solution that resulted from mixing 4 ml of nitric acid (68 to 70 weight %, by Wako Pure Chemical Industries) with an aqueous solution in which 0.5 g of NaF (purity 99%, by Wako Pure Chemical Industries) were dissolved in 9 ml of pure water. The resulting solution was stirred for 6 hours using a stirrer, to wash the phosphor powder thereby. The washed powder was repeatedly filtered and washed with water, according to ordinary procedures, until electrical conductivity dropped to 10 μS/cm or less. Thereafter, the washed product was dried for 2 hours at 150° C., to yield the phosphor of Example 1. Table 6 gives the charging composition of the starting materials; the molar ratios a through e for the charging composition of starting materials in Table 6, represented by $Si_aAl_bO_cN_d$:$Eu_e$, are given in Table 7.

Figure 4:
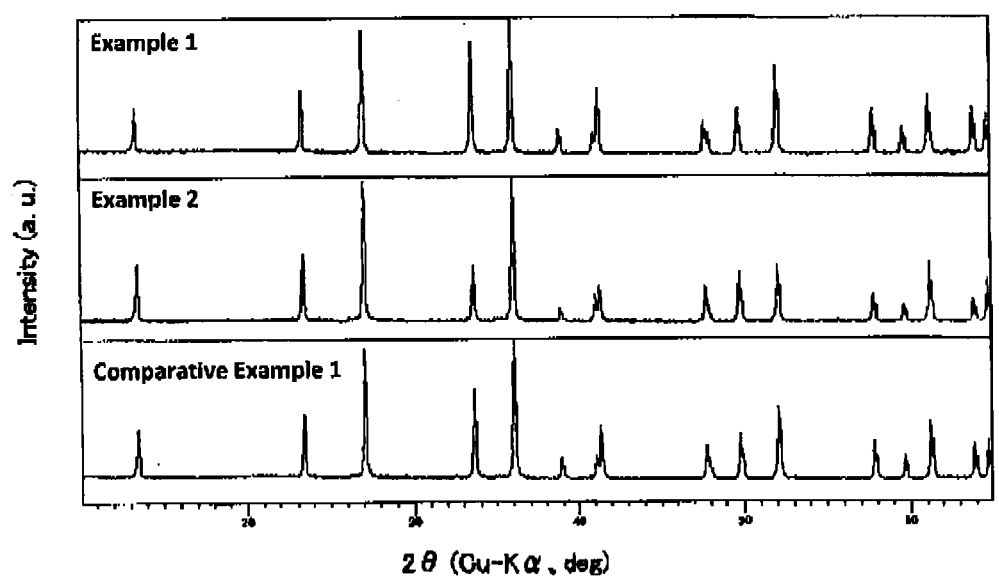
FIG. 4 shows an X-ray pattern, obtained by powder X-ray diffraction, of a phosphor produced in each of Examples 1 and 2 and Comparative Example 1.

The obtained phosphor was inspected by powder X-ray diffraction. The obtained X-ray pattern (FIG. 4) reveals a β-typo $Si_3N_4$ structure. Therefore, it was found that the phosphor was a β-type sialon phosphor.

Example 2

A phosphor of Example 2 was obtained in the same way as in Example 1, but herein the charging composition was the composition given in Table 6. The obtained phosphor was inspected by powder X-ray diffraction. The obtained X-ray pattern (FIG. 4) reveals a β-type $Si_3N_4$ structure. Therefore, it was found that the phosphor was a β-type sialon phosphor.

Examples 3 to 10

Phosphors of Examples 3 to 10 were obtained in the same way as in Example 1, but herein the charging compositions were as given in Table 6; in particular, 1.0 weight % of SiC having a particle diameter of 0.27 μm, by Wako Pure Chemical Industries, was added to the phosphors of Example 3 and Example 6. These phosphors as well were found to be β-type sialon phosphors by powder X-ray diffraction.

Example 11

A phosphor of Example 11 was obtained in the same way as in Example 1, but herein the charging composition was the composition given in Table 6; in particular, there was added 0.35 mass % of silicon oxide (SO-E5) by Admatechs, to yield the phosphor of Example 11. This phosphor as well was found to be a β-type sialon phosphor by powder X-ray diffraction.

Comparative Example 1

A phosphor of Comparative Example 1 was obtained in the same way as in Example 1, but herein the charging composition was the composition given in Table 6. The obtained phosphor was inspected by powder X-ray diffraction. The obtained X-ray pattern (FIG. 4) reveals a β-type $Si_3N_4$ structure. Therefore, it was found that the phosphor was a β-type sialon phosphor.

Comparative Examples 2 to 4

Phosphors of Comparative Examples 2 to 4 were obtained in the same way as in Example 1, but herein the charging compositions were the compositions given in Table 6. These phosphors as well were found to be β-type sialon phosphors by powder X-ray diffraction.

TABLE 6

Charging compositions of starting materials of Examples 1 to 11 and Comparative Examples 1 to 4

| | Charging composition (weight %) | | | | | |
|---|---|---|---|---|---|---|
| | $Si_3N_4$ | $Eu_2O_3$ | AlN | $Al_2O_3$ | SiC | $SiO_2$ |
| Example 1 | 95.25 | 1.06 | 3.29 | 0.40 | — | — |
| Example 2 | 95.09 | 1.06 | 2.72 | 1.13 | — | — |
| Example 3 | 96.74 | 0.74 | 1.52 | — | 1.00 | — |
| Example 4 | 96.21 | 0.74 | 3.05 | — | — | — |
| Example 5 | 96.10 | 0.74 | 2.60 | 0.56 | — | — |
| Example 6 | 96.51 | 0.97 | 1.52 | — | 1.00 | — |
| Example 7 | 95.98 | 0.97 | 3.05 | — | — | — |
| Example 8 | 95.89 | 0.97 | 2.64 | 0.50 | — | — |
| Example 9 | 95.37 | 0.97 | 3.66 | — | — | — |
| Example 10 | 95.21 | 1.13 | 3.66 | — | — | — |
| Example 11 | 94.99 | 1.06 | 3.60 | — | — | 0.35 |
| Comparative Example 1 | 94.96 | 1.06 | 2.14 | 1.84 | — | — |
| Comparative Example 2 | 97.74 | 0.74 | 1.52 | — | — | — |
| Comparative Example 3 | 97.51 | 0.97 | 1.52 | — | — | — |
| Comparative Example 4 | 97.35 | 1.13 | 1.52 | — | — | — |

TABLE 7

Charging compositions of starting materials of Examples 1 to 11 and Comparative Examples 1 to 4 (case of $Si_aAl_bO_cN_d$: $Eu_e$)

| | a | b | c | d | e |
|---|---|---|---|---|---|
| Example 1 | 5.751 | 0.249 | 0.059 | 7.941 | 0.017 |
| Example 2 | 5.750 | 0.250 | 0.120 | 7.880 | 0.017 |
| Example 3 | 5.896 | 0.104 | 0.018 | 7.982 | 0.012 |
| Example 4 | 5.791 | 0.209 | 0.018 | 7.982 | 0.012 |
| Example 5 | 5.790 | 0.210 | 0.065 | 7.936 | 0.012 |
| Example 6 | 5.895 | 0.105 | 0.024 | 7.976 | 0.016 |
| Example 7 | 5.790 | 0.201 | 0.024 | 7.976 | 0.016 |
| Example 8 | 5.790 | 0.210 | 0.065 | 7.935 | 0.016 |
| Example 9 | 5.748 | 0.252 | 0.023 | 7.977 | 0.016 |
| Example 10 | 5.748 | 0.252 | 0.027 | 7.973 | 0.018 |
| Example 11 | 5.752 | 0.248 | 0.058 | 7.942 | 0.017 |
| Comparative Example 1 | 5.750 | 0.250 | 0.180 | 7.820 | 0.017 |
| Comparative Example 2 | 5.895 | 0.105 | 0.018 | 7.982 | 0.012 |
| Comparative Example 3 | 5.895 | 0.105 | 0.023 | 7.977 | 0.016 |
| Comparative Example 4 | 5.895 | 0.105 | 0.027 | 7.973 | 0.018 |

<Relative Luminance>

Firstly, luminance was measured at room temperature (25° C.) using a fluorescence spectrophotometer F-4500, by Hitachi. More specifically, the produced phosphors were irradiated with excitation light at a wavelength of 455 nm, to obtain emission spectra in a wavelength range from 480 nm or longer to 800 nm or shorter.

Relative luminance (hereafter also referred to simply as "luminance") was calculated in the form of a relative value of a stimulus value Y, in the XYZ color system, calculated according to JIS Z8724 over a range that excludes the excitation wavelength region from the emission spectrum that the visible region obtained in accordance with the above-described method, with respect to 100% as the value of a stimulus value Y worked out, in a similar manner, over a range that excludes the excitation wavelength from the emission spectrum obtained through excitation of a yellow phosphor $Y_3Al_5O_{12}$:Ce (product number: P46-Y3), by Mitsubishi Chemical, using excitation light of a wavelength 455 nm. Table 8 sets forth the luminance and CIE-coordinate x value and y value for the phosphors obtained in the Examples and Comparative Examples.

TABLE 8

Luminance and x value and y value in CIE color coordinates for Examples 1 to 11 and Comparative Examples 1 to 4

| | Luminance (%) | x | y |
|---|---|---|---|
| Example 1 | 114 | 0.340 | 0.628 |
| Example 2 | 100 | 0.359 | 0.610 |
| Example 3 | 96 | 0.348 | 0.616 |
| Example 4 | 122 | 0.342 | 0.626 |
| Example 5 | 119 | 0.348 | 0.622 |
| Example 6 | 109 | 0.353 | 0.614 |
| Example 7 | 135 | 0.354 | 0.617 |
| Example 8 | 118 | 0.351 | 0.619 |
| Example 9 | 130 | 0.347 | 0.622 |
| Example 10 | 121 | 0.352 | 0.619 |
| Example 11 | 123 | 0.349 | 0.620 |
| Comparative Example 1 | 91 | 0.355 | 0.612 |
| Comparative Example 2 | 89 | 0.322 | 0.634 |
| Comparative Example 3 | 70 | 0.310 | 0.637 |

TABLE 8-continued

Luminance and x value and y value in CIE color coordinates
for Examples 1 to 11 and Comparative Examples 1 to 4

|  | Luminance (%) | x | y |
|---|---|---|---|
| Comparative Example 4 | 76 | 0.317 | 0.634 |

<Quantum Efficiency (Absorption Efficiency $\alpha_q$, Internal Quantum Efficiency $\eta_i$ and External Quantum Efficiency $\eta_o$)>

To work out quantum efficiency (absorption efficiency $\alpha_q$, internal quantum efficiency $\eta_i$ and external quantum efficiency $\eta_o$), firstly a cell was packed with a phosphor sample to be measured (for instance, a powder of the phosphor) with the surface sufficiently smoothed so as to preserve measurement accuracy, and the cell was set on a condenser such as an integrating sphere.

A Xe lamp, as a light source for exciting the phosphor sample, was attached to the condenser. The emission source was adjusted using a filter and/or monochromator (diffraction grating spectroscope) In such a manner that the emission peak wavelength of the light source was monochromatic light of 450 nm.

The light from the emission source after having had the emission peak wavelength thereof thus adjusted was irradiated onto a phosphor sample to be measured, and a spectrum including emitted light (fluorescence) and reflected light was measured using a spectrometer (MCPD7000, by Otsuka Electronics).

(Absorption Efficiency $\alpha_q$)

The absorption efficiency $\alpha_q$ was calculated by dividing the number of photons $N_{abs}$ of excitation light, absorbed by the phosphor sample, by the total number of photons N in the excitation light. A specific calculation procedure is described below.

Firstly, the latter term, i.e. the total number of photons N of the excitation light was worked out as follows.

Specifically, a substance having reflectance R of substantially 100% towards the excitation light, for instance a white reflective plate "Spectralon" by Labsphere (98% of reflectance R to excitation light of 450 nm), was disposed, as a sample to be measured, on the above-described condenser, in the same way as the phosphor sample; then, the reflection spectrum (hereinafter "$I_{ref}(\lambda)$") thereof was measured using the abovementioned spectrometer.

A numerical value given by (Expression I) below was worked out from the reflection spectrum $I_{ref}(\lambda)$. The interval of integration of (Expression I) below was set to range from 435 nm or longer to 465 nm or shorter. The numerical value represented by (Expression I) is proportional to the total number of photons N of the excitation light.

[Math. 1]

$$\frac{1}{R}\int \lambda \cdot I_{ref}(\lambda)d\lambda \qquad \text{[Expression I]}$$

A numerical value represented by (Expression II) below was worked out from the reflection spectrum $I(\lambda)$ of the time at which the phosphor sample, the absorption efficiency $\alpha_q$ whereof is to be measured, was attached to the condenser. The same interval of integration prescribed for (Expression I) was set as the interval of integration of (Expression II). The numerical value worked out based on (Expression II) below is proportional to the number of photons $N_{abs}$ of excitation light absorbed by the phosphor sample.

[Math. 2]

$$\frac{1}{R}\int \lambda \cdot I_{ref}(\lambda)d\lambda - \int \lambda \cdot I(\lambda)d\lambda \qquad \text{[Expression II]}$$

The absorption efficiency $\alpha_q$ was calculated based on the expression below.

Absorption efficiency $\alpha_q = N_{abs}/N =$ (Expression II)/(Expression I)

(Internal Quantum Efficiency $\eta_i$)

The internal quantum efficiency $\eta_i$ was calculated by dividing the number of photons $N_{PL}$ that are derived from fluorescence phenomena by the number of photons $N_{abs}$ absorbed by the phosphor sample.

A numerical value represented by (Expression III) was worked out from $I(\lambda)$. The lower limit of the interval of integration of (Expression III) was set to 466 nm or longer to 180 nm or shorter. The numerical value worked out from (Expression III) is proportional to the number of photons $N_{PL}$ that are derived from fluorescence phenomena.

[Math. 3]

$$\int \lambda \cdot I(\lambda)d\lambda \qquad \text{(Expression III)}$$

The internal quantum efficiency $\eta_i$ was worked out according to the expression below.

$\eta =$ (Expression III)/(Expression II)

(External Quantum Efficiency $\eta_o$)

The external quantum efficiency $\eta_o$ is calculated by multiplying the absorption efficiency $\alpha_q$ and the internal quantum efficiency $\eta_i$ worked out according to the above-described procedures. Table 9 sets forth the external quantum efficiency of the phosphors obtained in Examples 1 and 2 and Comparative Example 1.

TABLE 9

External quantum efficiency of Examples
1 and 2 and Comparative Example 1

|  | External quantum efficiency (%) |
|---|---|
| Example 1 | 51.8 |
| Example 2 | 48.8 |
| Comparative Example 1 | 44.9 |

(Composition Analysis)

The composition of the phosphors of Examples 1 to 31 and Comparative Examples 1 to 4 was analyzed.

The Si concentration, the Al concentration and the Eu concentration were measured by ICP emission spectroscopy using an instrument ULTIMA2C by Horiba.

The oxygen concentration and the nitrogen concentration were measured using an oxygen-nitrogen spectrometer TC600 by LECO. The oxygen concentration was measured in accordance with an inert gas fusion-infrared absorption method, and the nitrogen concentration was measured in accordance with an Inert gas fusion-thermal conductivity method.

The results of the measurements are given in Table 10. Table 11 sets forth the Al/O mass concentration ratio, O/Eu mass concentration ratio and Al/Eu mass concentration ratio in the Examples and Comparative Examples, as calculated on the basis of the obtained composition analysis results.

TABLE 10

Composition analysis results of Examples 1 to 11 and Comparative Examples 1 to 4

| | Al Concentration (mass %) | O (oxygen) Concentration (mass %) | Al/O Concentration ratio | Si concentration (mass %) | N (nitrogen) Concentration (mass %) | Eu Concentration (mass %) |
|---|---|---|---|---|---|---|
| Example 1 | 1.77 | 0.76 | 2.33 | 58.74 | 38.10 | 0.60 |
| Example 2 | 2.24 | 1.12 | 2.00 | 57.84 | 38.37 | 0.67 |
| Example 3 | 0.93 | 0.39 | 2.38 | 59.52 | 38.66 | 0.50 |
| Example 4 | 1.55 | 0.65 | 2.37 | 59.02 | 38.35 | 0.43 |
| Example 5 | 1.79 | 0.85 | 2.10 | 58.36 | 38.49 | 0.50 |
| Example 6 | 0.89 | 0.39 | 2.28 | 58.32 | 39.72 | 0.68 |
| Example 7 | 1.51 | 0.63 | 2.37 | 58.22 | 39.02 | 0.63 |
| Example 8 | 1.61 | 0.79 | 2.04 | 57.62 | 39.38 | 0.60 |
| Example 9 | 1.62 | 0.66 | 2.46 | 57.61 | 39.58 | 0.53 |
| Example 10 | 1.78 | 0.68 | 2.64 | 58.51 | 38.35 | 0.68 |
| Example 11 | 2.14 | 1.00 | 2.14 | 56.80 | 39.40 | 0.72 |
| Comparative Example 1 | 2.30 | 1.18 | 1.95 | 57.02 | 38.88 | 0.64 |
| Comparative Example 2 | 0.93 | 0.53 | 1.77 | 58.25 | 39.83 | 0.45 |
| Comparative Example 3 | 0.91 | 0.52 | 1.75 | 57.74 | 40.33 | 0.49 |
| Comparative Example 4 | 0.94 | 0.49 | 1.91 | 58.25 | 39.86 | 0.45 |

TABLE 11

Mass concentration ratios of composition elements in Examples 1 to 11 and Comparative Examples 1 to 4

| | Al/O concentration ratio | O/Eu Concentration ratio | Al/Eu Concentration ratio |
|---|---|---|---|
| Example 1 | 2.33 | 1.27 | 2.95 |
| Example 2 | 2.00 | 1.67 | 3.34 |
| Example 3 | 2.38 | 0.79 | 1.87 |
| Example 4 | 2.37 | 1.52 | 3.61 |
| Example 5 | 2.10 | 1.70 | 3.58 |
| Example 6 | 2.28 | 0.57 | 1.31 |
| Example 7 | 2.37 | 1.01 | 2.40 |
| Example 8 | 2.04 | 1.32 | 2.68 |
| Example 9 | 2.46 | 1.24 | 3.06 |
| Example 10 | 2.64 | 0.99 | 2.62 |
| Example 11 | 2.14 | 1.39 | 2.97 |
| Comparative Example 1 | 1.95 | 1.18 | 2.07 |
| Comparative Example 2 | 1.77 | 1.06 | 1.86 |
| Comparative Example 3 | 1.75 | 1.09 | 2.08 |
| Comparative Example 4 | 1.91 | 1.84 | 3.59 |

(Phosphor Particle Shape)
<Micrographs by Scanning Electron Microscopy (SEM)>

Figure 5:
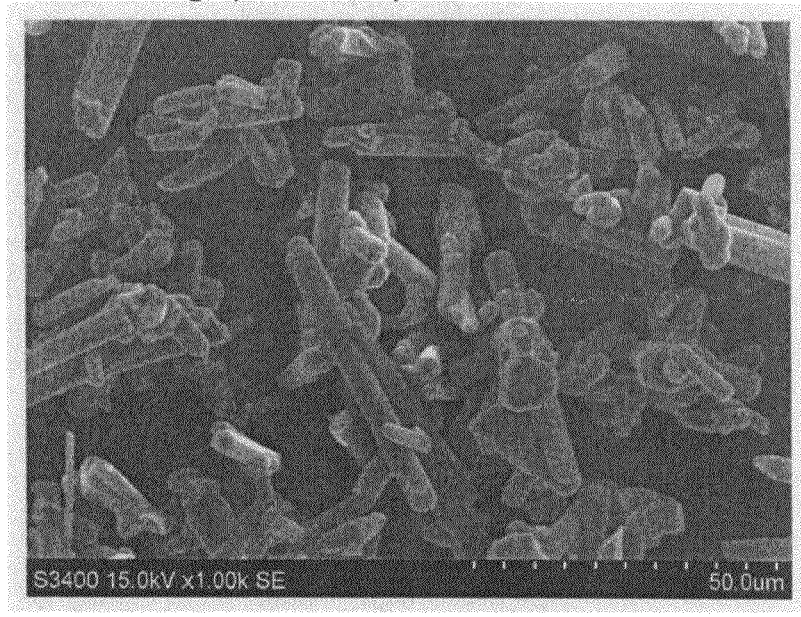
FIG. 5 is a micrograph (substituting for a drawing) illustrating a SEM observation result of the phosphor produced in Example 1.
Figure 6:
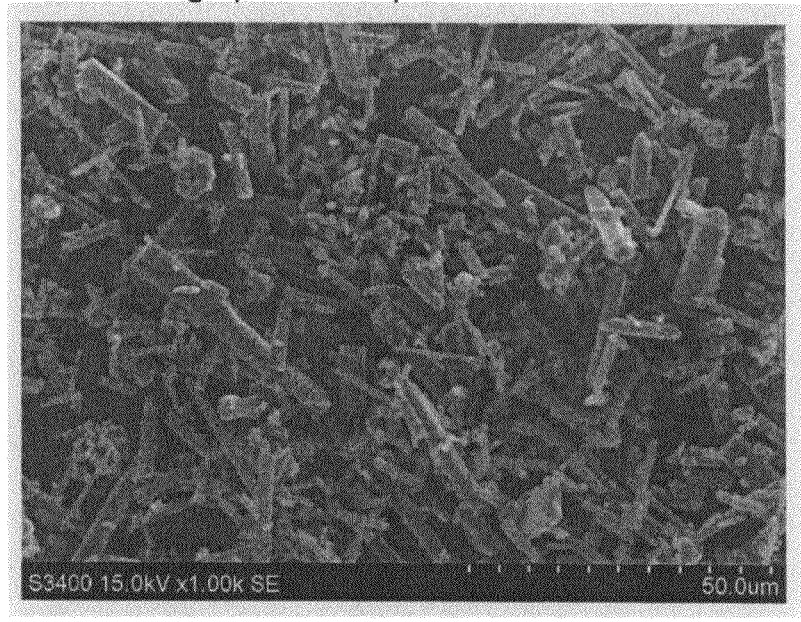
FIG. 6 is a micrograph (substituting for a drawing) illustrating a SEM observation result of the phosphor produced in Example 2.
Figure 7:
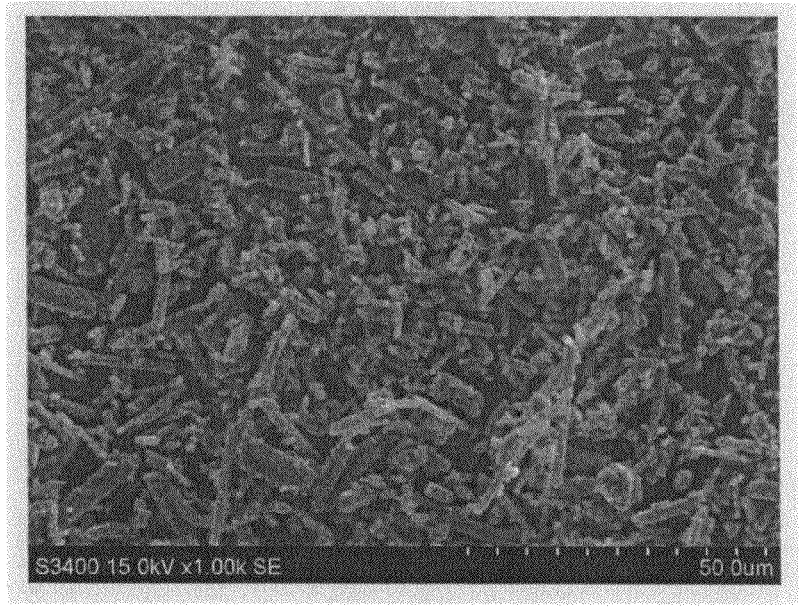
FIG. 7 is a micrograph (substituting for a drawing) illustrating a SEM observation result of the phosphor produced in Comparative Example 1.

To observe the shape and so forth of phosphor particles, SEM micrographs were taken for Examples 1 and 2 and Comparative Example 1 at 1000 magnifications using a SEM (S-3400N, by Hitachi). The micrographs are depicted in FIG. 5 to FIG. 7. Examples 1 and 2 exhibited larger particles and greater promotion of crystal growth, as compared with those of the phosphor of Comparative Example 1.

Figure 8:
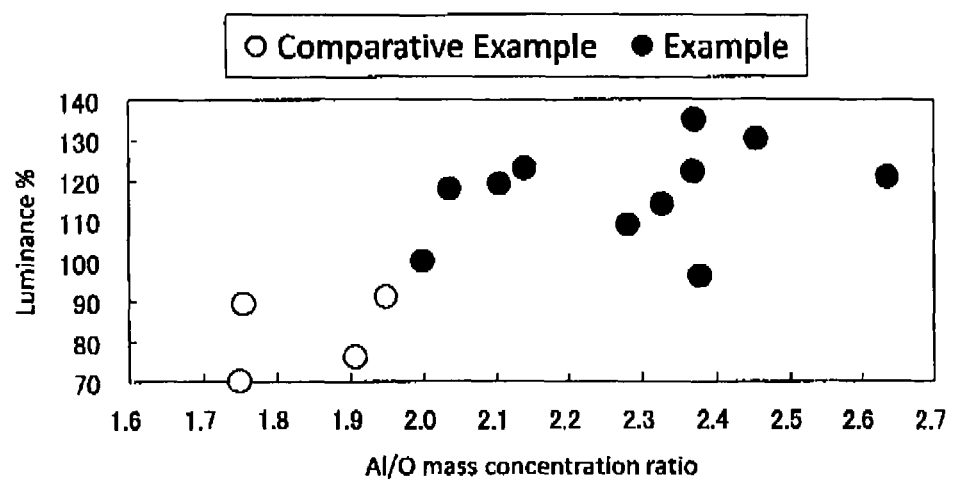
FIG. 8 is a graph illustrating the relationship between luminance and mass concentration ratio (Al/O) of Al and O (oxygen) in Examples 1 to 11 and Comparative Examples 1 to 4.
Figure 9:
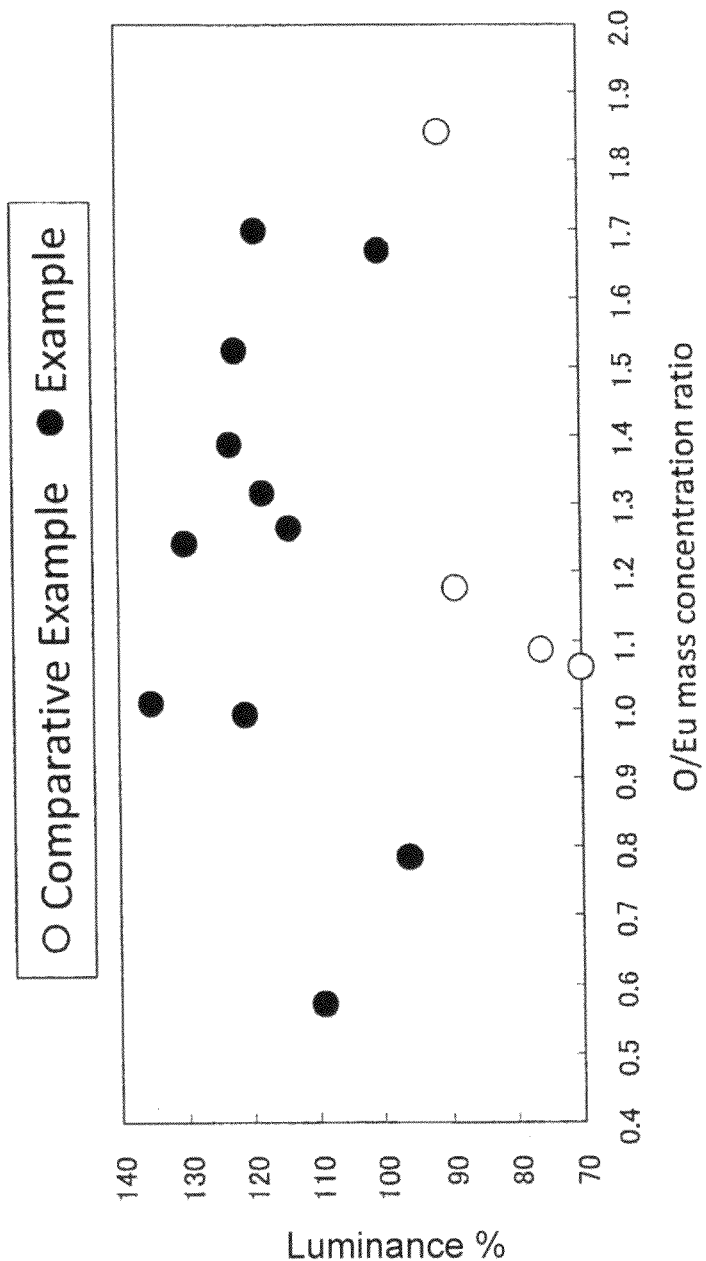
FIG. 9 is a graph illustrating the relationship between luminance and mass concentration ratio (O/Eu) of O (oxygen) and Eu in Examples 1 to 11 and Comparative Examples 1 to 4.
Figure 10:
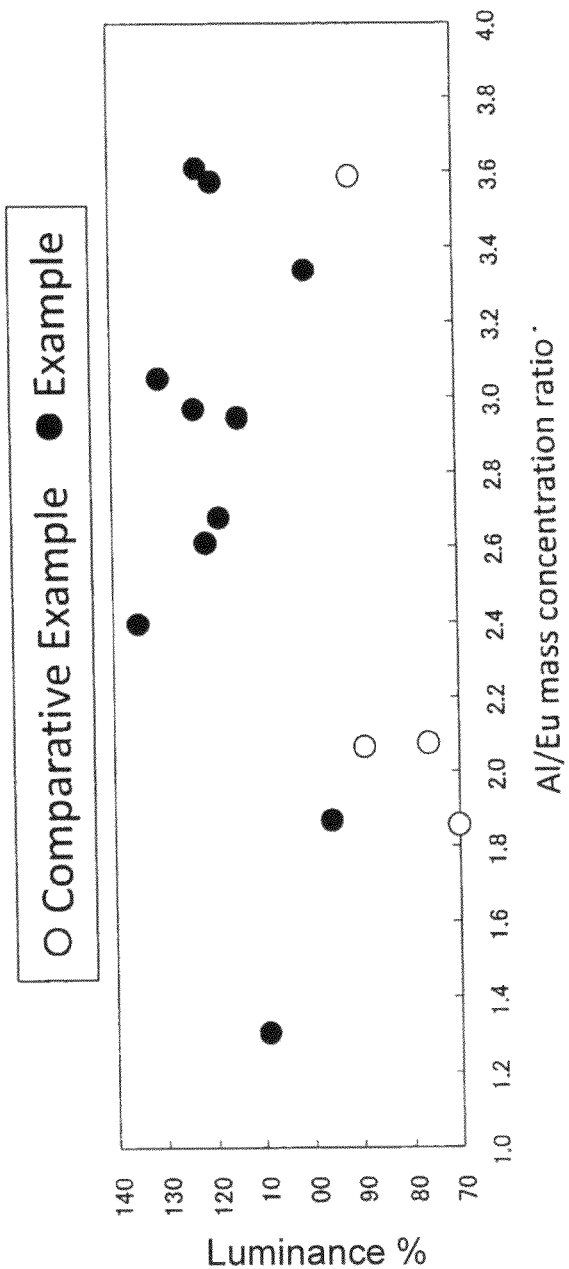
FIG. 10 is a graph illustrating the relationship between luminance and mass concentration ratio (Al/Eu) of Al and Eu in Examples 1 to 11 and Comparative Examples 1 to 4.
Figure 11:
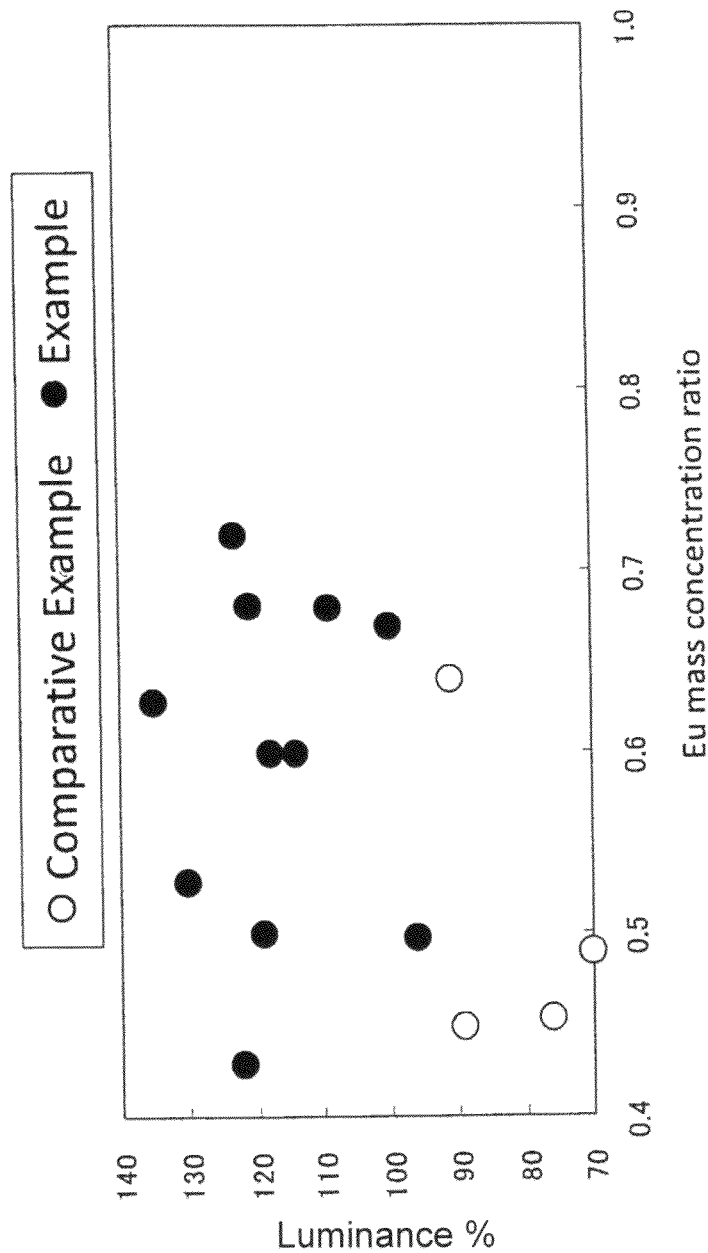
FIG. 11 is a graph illustrating the relationship between luminance and mass concentration of Eu in Examples 1 to 11 and Comparative Examples 1 to 4.
Figure 12:
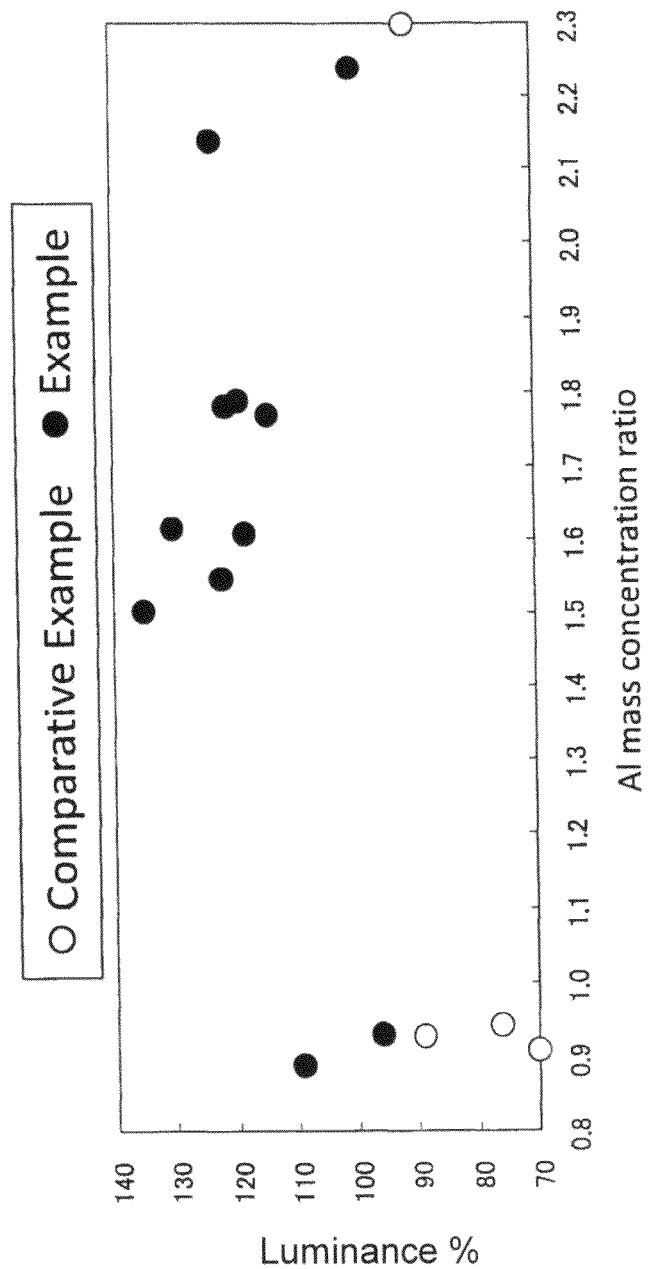
FIG. 12 is a graph illustrating the relationship between luminance and mass concentration of Al in Examples 1 to 11 and Comparative Examples 1 to 4.
Figure 13:
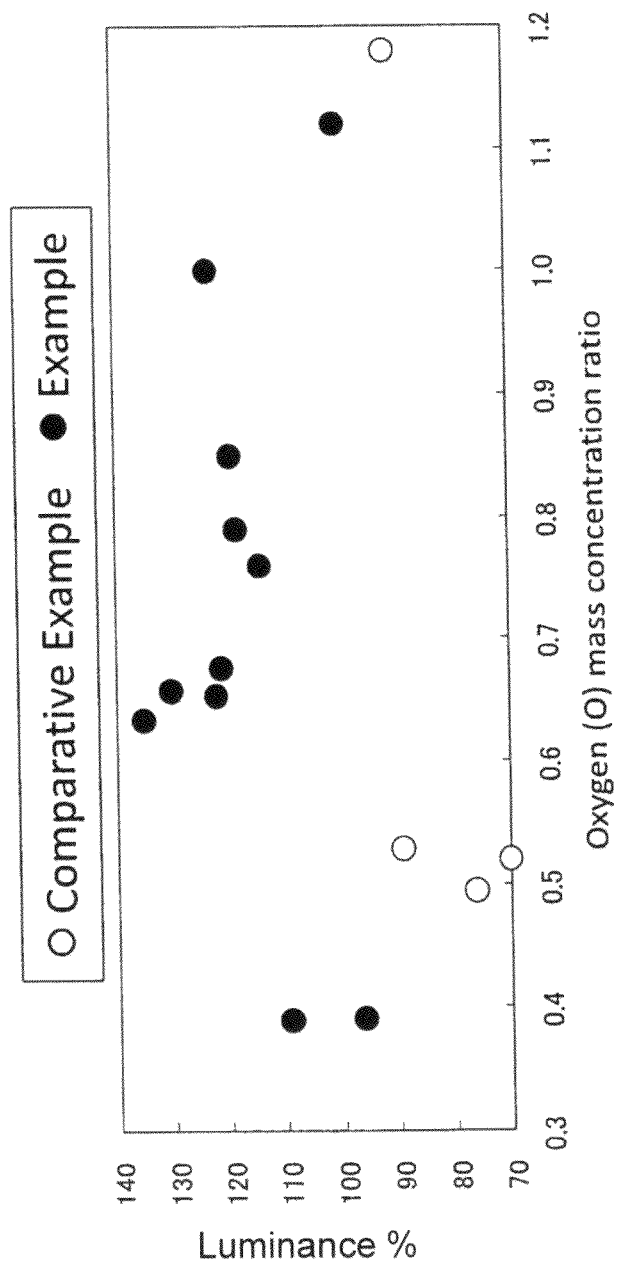
FIG. 13 is a graph illustrating the relationship between luminance and mass concentration of O (oxygen) in Examples 1 to 11 and Comparative Examples 1 to 4.

(Phosphor Composition and Luminance)
FIG. 8 illustrates the relationship between luminance and the mass concentration ratio (Al/O) of Al and O (oxygen) in Examples 1 to 11 and Comparative Examples 1 to 4. Similarly, FIG. 9 illustrates the relationship between luminance and the mass concentration ratio (O/Eu) of O (oxygen) and Eu in Examples 1 to 11 and Comparative Examples 1 to 4; FIG. 10 illustrates the relationship between luminance and the mass concentration ratio (Al/Eu) of Al and Eu; FIG. 11 illustrates the relationship between luminance and mass concentration of Eu; FIG. 12 illustrates the relationship between luminance and mass concentration of Al; and FIG. 13 illustrates the relationship between luminance and mass concentration of O (oxygen).

FIG. 9 to FIG. 13 reveals variability in the relationship between luminance, as an emission characteristic, and the content of the respective composition element in the β sialon phosphor. The composition of a β sialon phosphor having excellent emission characteristics cannot thus be determined across the board. However, FIG. 8 shows that luminance is markedly enhanced when the mass concentration ratio (Al/O) of Al and O (oxygen) is 2.0 or higher. This clearly indicates a close relationship between luminance and charge compensation of Eu comprised in β sialon.

While the invention has been described in detail and with reference to specific embodiments thereof, it will be apparent to one skilled in the art that various changes and modifications can be made therein without departing from the spirit and scope thereof.

INDUSTRIAL APPLICABILITY

The phosphor produced in accordance with the production method of the present invention can be used in any technical fields where light is involved. For instance, the phosphor can be suitably used in indoor and outdoor illumination, and also in image display devices of various electronic devices such as cell phones, domestic electrically appliances, outdoor displays and the like.

EXPLANATION OF NUMERALS

1: phosphor-containing part (second luminous body)
2: excitation light source (first luminous body) (LD)
3: substrate
4: light emitting device
5: mount lead
6: inner lead 7: excitation light source (first luminous body)
8: phosphor-containing part
9: conductive wire
10: mold member
11: surface-emitting illuminating device
12: holding case
13: light emitting device
14: diffusion plate
22: excitation light source (first luminous body)
23: phosphor-containing part (second luminous body)
24: frame
25: conductive wire
26: electrode
27: electrode

The invention claimed is:

1. A β-type sialon phosphor, comprising Si, Al, O, N, and Eu, wherein
   an Al concentration in the phosphor ranges from 0.90 mass % or higher to 2.25 mass % or lower,
   an O concentration ranges from 0.36 mass % or higher to 1.15 mass % or lower,
   an Eu concentration ranges from 0.40 mass % or higher to 0.80 mass % or lower, and
   a ratio (Al/O) of the Al concentration with respect to the O concentration ranges from 2.0 or higher to 3.0 or lower.

2. The β-type sialon phosphor according to claim 1, wherein a x value in the CIE color coordinates ranges from 0.335 or grater to 0.365 or smaller, and a y value in the CIE color coordinates ranges from 0.600 or greater to 0.630 or smaller.

3. The β-type sialon phosphor according to claim 1, wherein
   the O concentration is greater than 0.60 mass % and 1.15 mass % or lower.

4. The β-type sialon phosphor according to claim 1, wherein the phosphor is produced by way of a thermal treatment process.

5. The β-type sialon phosphor according to claim 1, wherein the phosphor is produced by way of a washing process.

6. The β-type sialon phosphor according to claim 5, wherein the phosphor is produced by using, in the washing process, an aqueous solution A of a fluoride that is solid at 20° C. and that has a solubility at 20° C. ranging from 0.01 g/100 ml of water or higher to 400 g/100 ml of water or lower, and an aqueous solution B that comprises at least one inorganic acid other than hydrofluoric acid.

7. A method for producing the β-type sialon phosphor according to claim 1, comprising:
   firing a phosphor starting material in the presence of a compound that comprises carbon and one or more elements selected from the group consisting of Si, Al, Eu and N.

8. A method for producing the β-type sialon phosphor according to claim 1, comprising: firing a phosphor starting material in the presence of $SiO_2$.

9. A light-emitting device, comprising:
   a first luminous body; and
   a second luminous body that can emit light through conversion, to visible light, of light from the first luminous body,
   wherein the second luminous body comprises at least the phosphor according to claim 1.

* * * * *